(12) United States Patent
Fukada et al.

(10) Patent No.: US 7,081,671 B2
(45) Date of Patent: Jul. 25, 2006

(54) POWER MODULE

(75) Inventors: Masakazu Fukada, Tokyo (JP); Dai Nakajima, Tokyo (JP); Ken Takanashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/216,789

(22) Filed: Aug. 13, 2002

(65) Prior Publication Data

US 2002/0186545 A1 Dec. 12, 2002

Related U.S. Application Data

(63) Continuation of application No. 09/671,172, filed on Sep. 28, 2000, now Pat. No. 6,501,172.

(30) Foreign Application Priority Data

May 25, 2000 (JP) ............ P2000-154600

(51) Int. Cl.
  *H01L 23/34* (2006.01)
(52) U.S. Cl. ............ 257/714; 257/723; 257/707
(58) Field of Classification Search ........... 257/714, 257/706, 707, 777, 723, 724, 686, 516, 532
  See application file for complete search history.

(56) References Cited

U.S. PATENT DOCUMENTS

| | | | |
|---|---|---|---|
| 4,376,287 A * | 3/1983 | Sechi | |
| 4,527,185 A * | 7/1985 | Philofsky et al. | |
| 4,675,717 A * | 6/1987 | Herrero et al. | 257/777 |
| 4,858,073 A * | 8/1989 | Grgory et al. | |
| 5,281,846 A * | 1/1994 | Kaiser | 257/528 |
| 5,313,361 A * | 5/1994 | Martin | |
| 5,504,378 A * | 4/1996 | Lindberg et al. | |
| 5,864,177 A * | 1/1999 | Sundstrom | 257/723 |
| 6,018,192 A * | 1/2000 | Root et al. | |
| 6,075,712 A * | 6/2000 | McMahon | |
| 6,127,724 A * | 10/2000 | DiStefano | 257/675 |
| 6,181,008 B1 * | 1/2001 | Avery et al. | |
| 6,222,246 B1 * | 4/2001 | Mak et al. | |
| 6,361,525 B1 * | 3/2002 | Capes et al. | 604/240 |
| 6,373,705 B1 | 4/2002 | Koelle et al. | |
| 6,798,639 B1 * | 9/2004 | Faris et al. | 361/302 |

FOREIGN PATENT DOCUMENTS

| | | |
|---|---|---|
| DE | 691 05 020 | 6/1995 |
| DE | 199 00 603 | 7/2000 |
| EP | 0 449 640 | 10/1991 |
| EP | 0 508 717 | 10/1992 |

* cited by examiner

*Primary Examiner*—S. V. Clark
(74) *Attorney, Agent, or Firm*—Oblon, Spivak, McClelland, Maier & Neustadt, P.C.

(57) ABSTRACT

In a power module (111), a free-wheeling diode (1A), an IGBT (1B), and a capacitor (20) for smoothing direct current are disposed directly on a surface (2BS) of a conductive heat sink (2B) with through holes (2BH). The rear electrodes of the free wheeling diode (1A), the IGBT (1B), and the capacitor (20) are bonded to the heat sink (2B) for example with solder, whereby the diode (1A), the IGBT (1B), and the capacitor (20) are electrically connected with the heat sink (2B). The front electrodes of the diode (1A), the IGBT (1B), and the capacitor (20) are connected with each other for example by wires (7). In the heat sink (2B), a cooling medium flows through the through holes (2BH). Such a configuration allows miniaturization of the power module and improves the cooling performance and reliability of the power module.

4 Claims, 25 Drawing Sheets

F I G. 13
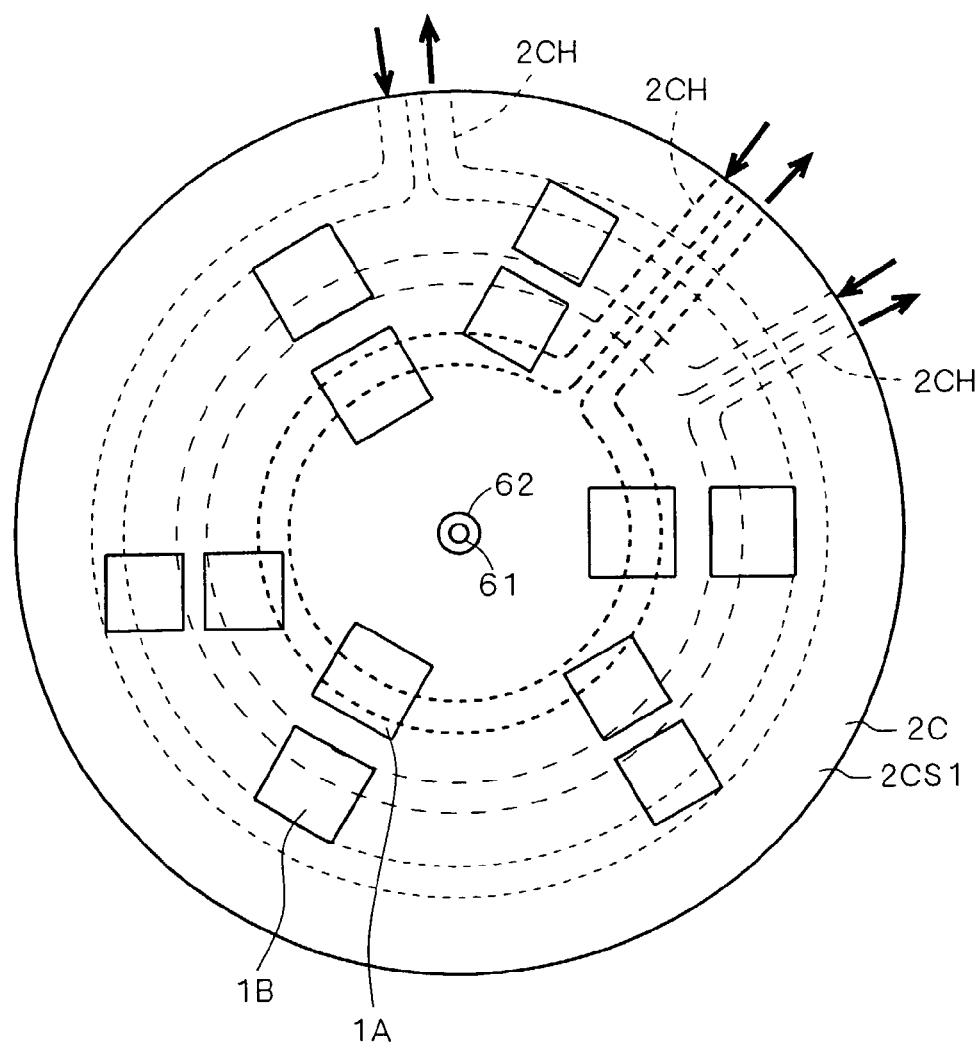

F I G. 14
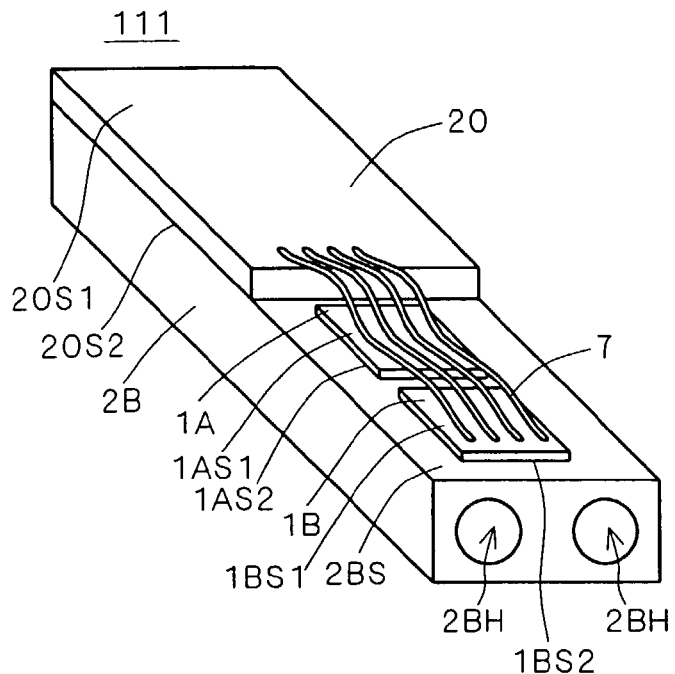
F I G. 15
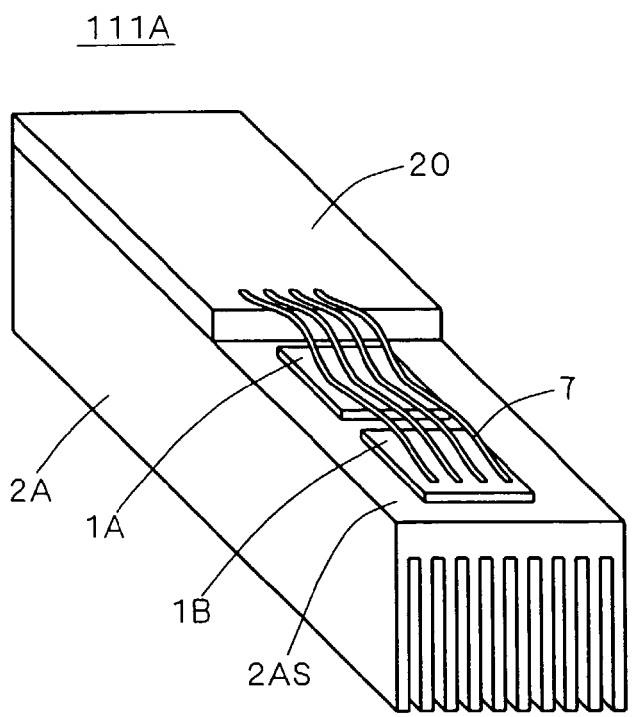

F I G. 30
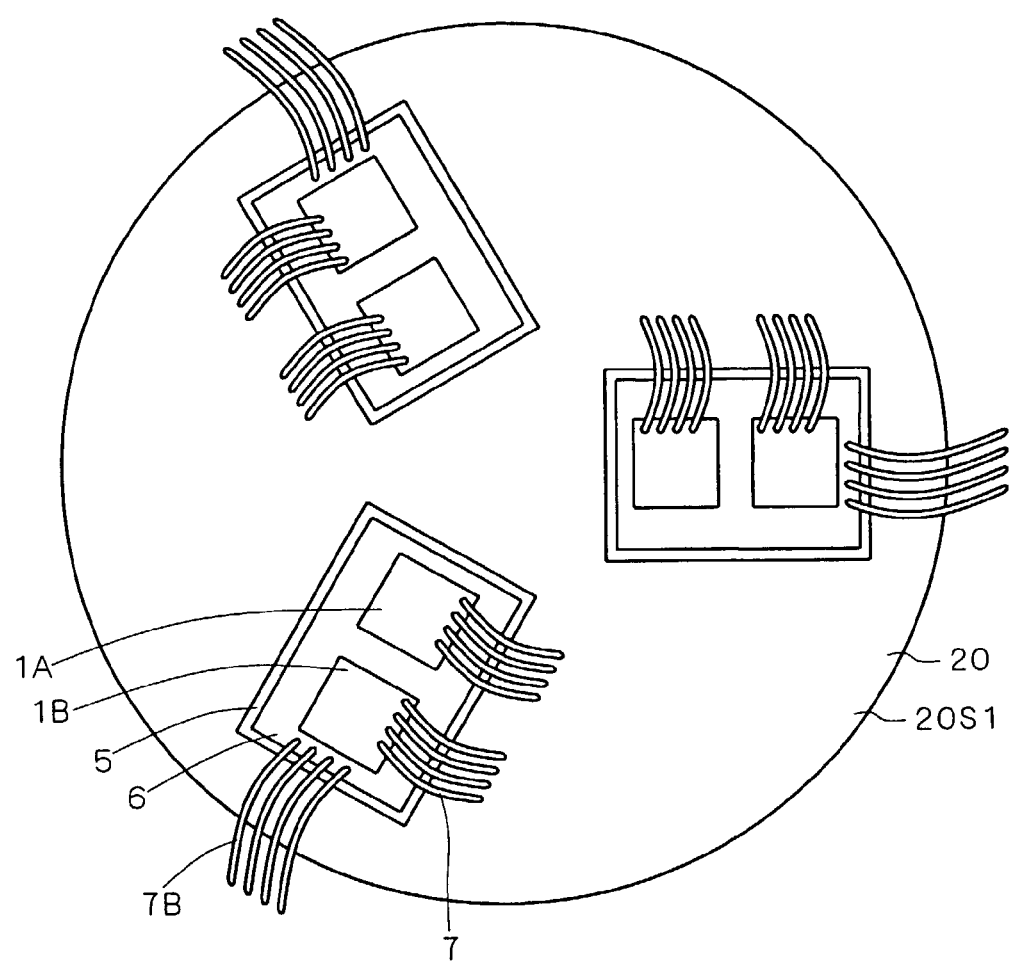

POWER MODULE

BACKGROUND OF THE INVENTION

1. Field of the Invention

The present invention relates to power modules and especially to techniques for improving cooling performance of power modules.

2. Description of the Background Art

FIG. 34 is a schematic external view of a first conventional power module 101P. In the power module 101P, a copper base plate 9P is disposed through a heat-conducting grease (not shown) over a radiating fin or heat sink 2AP, and an insulating substrate 5P is disposed on the base plate 9P. On the insulating substrate 5P, there are disposed a freewheeling diode 1AP (hereinafter also referred to as "diode") and an insulated gate bipolar transistor 1BP (hereinafter referred to as "IGBT").

In the conventional power module 101P, copper foils 6P are placed on both main surfaces of the insulating substrate 5P. The base plate 9P and the copper foil 6P are bonded together with solder, and the diode 1AP and the IGBT 1BT are soldered onto the copper foil 6P. An electrode 3P is provided through an insulating layer 4P over the radiating fin 2AP. Then, predetermined electrical connections are made by wires 7P. The construction including the radiating fin 2AP, the diode 1AP, the IGBT 1BP, and the like is housed in a case (not shown).

The electrode 3P is connected to a bus bar or wiring 91P which extends toward the outside of the case. Outside the case, a current transformer 92P for current detection is attached to the bus bar 91P. Further, a cylindrical capacitor 8P for smoothing direct current is provided outside the case independently of the radiating fin 2P and the like (the connection with the case is omitted in the figure).

FIG. 35 is a schematic external view of a second conventional power module 102P. The power module 102P has no base plate 9P as above described, wherein the insulating substrate 5P is disposed through a heat-conducting grease over the radiating fin 2AP. The power module 102P is in all other aspects identical to the above-mentioned power module 101P.

FIG. 36 is a schematic external view of a third conventional power module 103P. The power module 103P is a so-called power transducer. In the power module 103P, all the diodes 1AP and IGBTs 1BP are disposed on the insulating substrates 5P. A heat sink 2BP of the power module 103P has through holes 2BHP therethrough passing a cooling medium. The power module 103P is in all other aspects identical to the above-mentioned power module 101P.

The conventional power modules 101P, 102P, and 103P have the following problems.

First is low temperature reliability during operation. More specifically, when the thermal expansion coefficient of the heat sink 2AP or 2BP differs from those of the diode(s) 1AP and the IGBT(s) 1BP, thermal stresses responsive to a temperature difference from the freezing point of solder will occur at the solder joints as above described. There is thus a problem of occurrence and progress of cracking at the solder joints through a heat cycle (or temperature cycle) in the use (or operation) of the power module 101P, 102P, 103P and/or a heat cycle by repetitions of start and halt of the power module. Such cracking at the solder joints reduces the longevity of the power module.

To reduce the above thermal stresses, it is contemplated for example to increase solder thickness (e.g., 300 μm or more). However, such increased thickness of solder increases thermal resistance between the heat sink 2AP or 2BP and the diode(s) 1AP and the like. This brings up another problem that the size of the heat sink 2AP or 2BP must be increased.

Further, in the conventional power modules 101P, 102P, and 103P, the distribution of temperature in the insulating substrate(s) 5P, the base plate 9P, and the like due to heat generation in the diode(s) 1AP and the like causes warps or winding in the insulating substrate(s) 5P and the like. When the temperature difference is great, clearance is created between the radiating fin 2AP, 2BP and the base plate 9P and the like. Thus, there is a problem of reduced heat transfer because the heat-conducting grease cannot completely fill in the space between the radiating fin 2AP, 2BP and the insulating substrate(s) 5P or the base plate 9P (due to the incoming air). Another problem is that the occurrence or progress of cracking at the solder joints, described above, may be encouraged. The formation of clearance thus results in deterioration in the reliability of the power module.

To prevent the formation of clearance, it is contemplated for example to make the temperature distribution uniform throughout the insulating substrate(s) 5P and the like, or to increase the rigidity of the insulating substrate(s) 5P and the like by increasing the thickness of the substrate(s) 5P and the like. However, such increased thickness increases thermal resistance between the heat sink 2AP, 2BP and the insulating substrate(s) 5P or the like. This brings up, as has been described, another problem that the size of the heat sink 2AP, 2BP must be increased.

Further, when the diode(s) 1AP and the IGBT(s) 1BP produce a large quantity of heat, the amount of current must be limited in order to ensure reliability since the characteristics of the elements vary with increasing temperature.

Secondly, each of the conventional power modules 101P, 102P, and 103P as a whole is large in size since the current transformer 92P and the cylindrical capacitor 8P are provided independently outside the case for such a module. Besides, the current transformer 92P has the property of becoming large when current to be measured has a large DC component, and also the current transformer 92P makes measurements with errors (about 5%) due to its characteristics changes caused by heat generation.

Thirdly, in the power module 103P, the distances from each of the power semiconductor devices, such as the diode 1AP or the IGBT 1BP, to the electrode 61P connected to the low potential side of the power transducer and to the electrode 62P connected to the high potential side vary according to where that power semiconductor device is located. This causes variations in the inductance of the wiring or wires 7P from one power semiconductor device to another, thereby causing variations in output voltage.

SUMMARY OF THE INVENTION

A first aspect of the present invention is directed to a power module comprising: a heat sink; a first power semiconductor device disposed directly on the heat sink; and a capacitor disposed directly on the heat sink.

According to a second aspect of the present invention, in the power module of the first aspect, the heat sink has a plurality of surfaces; and the first power semiconductor device and the capacitor are disposed on different ones of the surfaces of the heat sink.

According to a third aspect of the present invention, in the power module of the first or second aspect, the heat sink has a passage of a cooling medium.

According to a fourth aspect of the present invention, in the power module of either of the first through third aspects, the heat sink has conductivity; and an electrode of the first power semiconductor device and an electrode of the capacitor are directly bonded to the heat sink.

According to a fifth aspect of the present invention, the power module of the fourth aspect further comprises: an insulating substrate disposed on the heat sink; and a second power semiconductor device disposed through the insulating substrate over the heat sink.

According to a sixth aspect of the present invention, the power module of the fourth aspect further comprises: another heat sink; and a second power semiconductor device disposed directly on the another heat sink.

According to a seventh aspect of the present invention, in the power module of the sixth aspect, the another heat sink has conductivity; and an electrode of the second power semiconductor device is directly bonded to the another heat sink. The power module further comprises: an insulating member for insulating the another heat sink from the heat sink and the electrode of the capacitor.

According to an eighth aspect of the present invention, the power module of the seventh aspect further comprises: a conductive member disposed on the insulating member; and a flexible wire connected to the conductive member for providing an electrical connection between the first power semiconductor device and the second power semiconductor device.

A ninth aspect of the present invention is directed to a power module comprising: a capacitor; and a first semiconductor device disposed directly on an electrode of the capacitor.

According to a tenth aspect of the present invention, in the power module of the ninth aspect, the electrode of the capacitor has a passage of a cooling medium.

According to an eleventh aspect of the present invention, the power module of the ninth aspect further comprises: an insulating substrate disposed on the electrode of the capacitor; and a second power semiconductor device disposed through the insulating substrate over the electrode of the capacitor.

According to a twelfth aspect of the present invention, in the power module of either of the fifth through eighth and eleventh aspects, the first power semiconductor device and the second power semiconductor device are electrically connected with each other; the first power semiconductor device forms a lower arm of a power transducer; and the second power semiconductor device forms an upper arm of the power transducer.

According to a thirteenth aspect of the present invention, the power module of the twelfth aspect further comprises: a plurality of arms of the power transducer, including the upper arm and the lower arm; and a coaxial line protruding through a surface on which the first or second power semiconductor device is disposed, the coaxial line including a first electrode for supplying a first voltage to the first power semiconductor device of each of the lower arms and a second electrode for supplying a second voltage to the second power semiconductor device of each of the upper arms, wherein the plurality of arms are angularly spaced at regular intervals about the coaxial line.

A fourteenth aspect of the present invention is directed to a power module comprising: a plurality of heat sinks each having a passage of a cooling medium; a plurality of power semiconductor devices disposed on the heat sinks; and a casing having space and being capable of housing the plurality of heat sinks, wherein the plurality of heat sinks are arranged within the space of the casing, leaving a clearance therebetween, whereby continuous space including the clearance and the passages is formed within the space of the casing.

According to a fifteenth aspect of the present invention, in the power module of the fourteenth aspect, the passages of the heat sinks pass an insulative cooling medium.

In accordance with the first aspect, both the first power semiconductor device and the capacitor are directly disposed on the heat sink. The power module can thus be made lighter and smaller than conventional power modules wherein those components are provided independently. Further, the heat radiating action of the heat sink inhibits not only heat generation in the first power semiconductor device but also the temperature rise in the capacitor. This allows miniaturization of the capacitor, a reduction in inductance, and an increase in longevity.

Disposing both the first power semiconductor device and the capacitor directly on the heat sink also reduces the length of wiring between both of them shorter than that in the aforementioned conventional power modules. Thus, circuit inductance can be reduced. This reduces overshoot voltage at a switching operation of the first power semiconductor device, resulting in a reduction in withstand voltage and loss of the first power semiconductor device. The above short wiring length also reduces the occurrence of electromagnetic noise can be reduced.

Accordingly, a compact, lightweight, and highly reliable power module can be provided.

In accordance with the second aspect, the first power semiconductor device and the capacitor are disposed on different surfaces of the heat sink. This allows a further reduction in the size and weight of the power module as compared with the case of disposing both of them on the same surface. Further, less interference occurs between heat radiation in the first power semiconductor device and that in the capacitor, which improves heat radiating performance of the power module.

In accordance with the third aspect, passing a cooling medium through the passage in the heat sink further improves the cooling capability of the heat sink.

In accordance with the fourth aspect, the heat sink having conductivity can be used as an electrode. This reduces the number of components such as wires on the heat sink and processes related to the formation of such components.

Further, the electrodes of both the first power semiconductor device and the capacitor are directly bonded to the heat sink. That is, the first power semiconductor device and the capacitor are electrically connected with each other through the heat sink. In this case, the electrical connection between both the electrodes becomes shorter than in the case where both the electrodes are connected by wiring or the like. A resultant reduction in circuit inductance leads to a considerable reduction in the aforementioned overshoot voltage and the like.

In accordance with the fifth aspect, the second power semiconductor device is disposed through the insulating substrate over the heat sink. This makes it possible to dispose power semiconductor devices of different potentials together on a conductive heat sink in the formation of the circuit.

In accordance with the sixth aspect, the power module further comprises the second power semiconductor device disposed on another heat sink. The combination of the first and second power semiconductor devices simplifies circuit configuration.

In accordance with the seventh aspect, another conductive heat sink is insulated from the above-mentioned conductive heat sink and the electrode of the capacitor by the insulating member. The first and second power semiconductor devices can thus be set at different potentials without the use of any insulating substrate. This allows a reduction in the number of components by the number of insulating substrates. Further, since the construction including the first power semiconductor device and one heat sink and the construction including the second power semiconductor device and another heat sink are broadly equivalent, the manufacturing cost of the power module as a whole can be reduced. This results in the provision of a low-cost power module.

In accordance with the eighth aspect, when providing an electrical connection between the first and second power semiconductor devices, the flexible wire uses, as a relay or junction point, the conductive member disposed on the insulating member. This inhibits a deflection or the slack of the wire as compared with the case where those power semiconductor devices are directly connected by the flexible wire without the use of the above conductive member. As a result, short circuits due to the slack of the wire can be prevented.

In accordance with the ninth aspect, the first power semiconductor device is disposed directly on the electrode of the capacitor. The power module can thus be lighter and smaller than the conventional power modules wherein both components are provided independently. Further, since the electrode of the capacitor is used as a heat sink, the heat radiating action of the heat sink inhibits not only heat generation in the first power semiconductor device but also the temperature rise in the capacitor.

Disposing the first power semiconductor device on the electrode of the capacitor also makes the electrical connection between both of them considerably shorter than that in the aforementioned conventional power modules. Thus, circuit inductance can be reduced. This reduces overshoot voltage at a switching operation of the first power semiconductor device, resulting in a reduction in withstand voltage and loss of the first power semiconductor device. The above short wiring length also reduces the occurrence of electromagnetic noise.

Accordingly, a compact, lightweight, and highly reliable power module can be provided.

In accordance with the tenth aspect, passing a cooling medium through the passage in the electrode of the capacitor further improves the cooling capability of the power module.

In accordance with the eleventh aspect, the second power semiconductor device is disposed through the insulating substrate over the electrode of the capacitor. This makes it possible to dispose power semiconductor devices of different potentials together over the electrode of the capacitor in the formation of the circuit.

In accordance with the twelfth aspect, a highly reliable power transducer can be provided.

In accordance with the thirteenth aspect, the plurality of arms of the power transducer are angularly spaced at regular intervals about the coaxial line. Thus, the wiring between each arm and the first and second electrodes can be installed in a similar manner. This reduces variations in the output from each arm and variations in the first voltage, thereby offering considerable resistance to malfunctions.

In accordance with the fourteenth aspect, the plurality of heat sinks form continuous space including clearances and the passages in the heat sinks, within the space of the casing. At this time, the cooling medium passes through the passages in the heat sinks faster than when passing through the clearances. This improves the cooling capability of the heat sinks. On the other hand, when the cooling medium passes through the clearances, pressure loss is smaller than when the cooling medium passes through the passages. Thus, higher cooling performance can be achieved with smaller pressure loss.

In accordance with the fifteenth aspect, since an insulative cooling medium passes through the passages of the heat sinks, the power semiconductor devices can be isolated from each other without the use of any insulating substrate even if they are directly disposed on the conductive heat sinks. This allows a reduction in the number of components by the number of insulating substrates. Further, since the constructions each including the power semiconductor device and the heat sink are broadly equivalent, the manufacturing cost of the power module as a whole can be reduced. This results in the provision of a low-cost power module.

The aforementioned power semiconductor devices, which are insulated from each other, can be disposed directly on the conductive heat sinks. This improves heat radiating performance of the power module, thereby improving the reliability of the power module.

It is therefore an object of the present invention to provide a compact, lightweight, and highly reliable power module.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a schematic diagram of through holes in the power module according to the fifth preferred embodiment.

FIG. 14 is a schematic external view of a power module according to a sixth preferred embodiment.

FIG. 15 is a schematic external view of a power module as a first example modification in the sixth preferred embodiment.

FIGS. 28 to 30 are schematic diagrams of a power module according to an eleventh preferred embodiment.

DESCRIPTION OF THE PREFERRED EMBODIMENTS

First Preferred Embodiment

Figure 1:
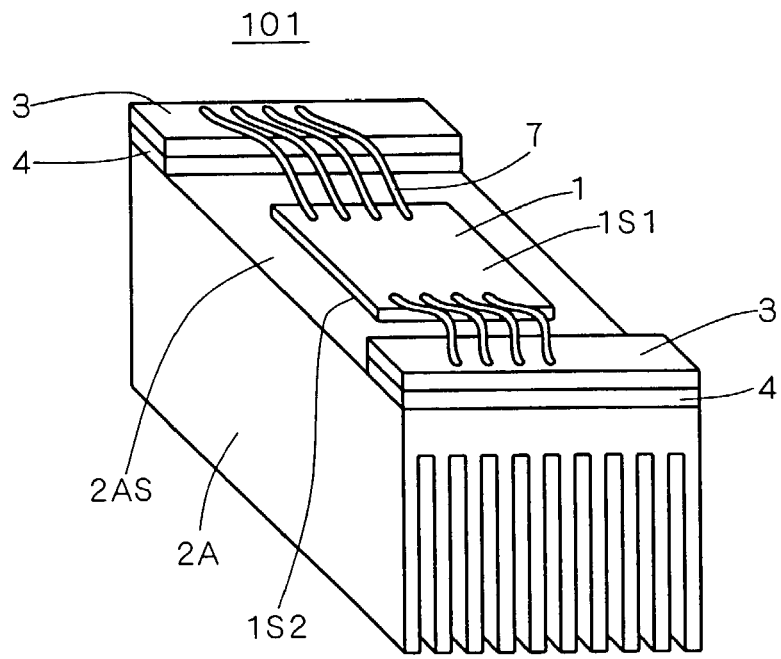
FIG. 1 is a schematic external view of a power module according to a first preferred embodiment.

FIG. 1 is a schematic external view of a power module 101 according to a first preferred embodiment. As shown in FIG. 1, the power module 101 comprises a power semiconductor device (e.g., free-wheeling diode or IGBT) 1 formed for example of a silicon (Si) substrate, a heat sink 2A, electrodes 3, insulating layers 4, and wires 7. For the sake of simplicity, the details of the power semiconductor device 1 is not illustrated in FIG. 1.

Specifically, the power semiconductor device 1 is disposed in immediate or direct contact with the heat sink 2A. The power semiconductor device 1 has main surfaces 1S1 and 1S2 corresponding to the main surfaces of the above-mentioned silicon substrate, in each of which an electrode is formed (not shown). One main surface (hereinafter referred to as "rear surface") 1S2 or the electrode (hereinafter referred to as "rear electrode") formed in the rear surface 1S2 is for example soldered onto a plane surface 2AS of the heat sink 2A.

Here "disposing the power semiconductor device 1 directly on the heat sink 2A" implies the absence of the insulating substrate 5P and the base plate 9P as were in the conventional power modules 101P, 102P, and 103P, and this form of "direct disposition" also includes such a configuration that an adhesive material (e.g., the above solder) is in between the power semiconductor device 1 and the heat sink 2A for bonding them together. Instead of solder, such an adhesive material may be a high-thermal-conductivity adhesive, e.g., an epoxy resin containing conductive powder such as aluminum or silver.

The heat sink 2A is made of a material whose thermal expansion coefficient is approximately equivalent to that of silicon, such as molybdenum (Mo), an alloy of copper (Cu) and molybdenum (Mo), tungsten (W), a carbon-fiber composite material, or the like. The heat sink 2A (material whose thermal expansion coefficient is approximately equivalent to that of silicon) may also be aluminum (Al) containing carbon (C) or silicon (Si), or the like. The heat sink 2A has a finned surface on the side opposite from the surface 2AS.

The insulating layers 4 are disposed on the heat sink 2A and the electrodes 3 are disposed on the insulating layers 4. That is, the electrodes 3 are disposed over the heat sink 2A but insulated from the heat sink 2A by the insulating layers 4. The electrodes 3 are electrically connected by the wires 7 to the electrode (hereinafter referred to as "front electrode") formed in the other main surface (hereinafter referred to as "front surface") 1S1 of the power semiconductor device 1. Such electrical connections between the electrodes 3 and the front electrode of the power semiconductor device 1 may be established by application of pressure or a conductive adhesive.

The power module 101 achieves the following effects. Since the power semiconductor device 1 and the heat sink 2A are broadly equivalent in thermal expansion coefficient, the power module 101, unlike the conventional power modules 101P, 102P, and 103P, can greatly inhibit the occurrence of cracking at the joints (solder joints) between the power semiconductor device 1 and the heat sink 2A due to the heat cycle. Accordingly, unlike the conventional power modules 101P, 102P, and 103P, the power module 101 does not have to increase solder thickness and can thus reduce thermal resistance between the power semiconductor device 1 and the heat sink 2A. This allows the heat sink to be made lighter and smaller.

Further, the temperature difference between the power semiconductor device 1 and the heat sink 2A can be reduced since the power semiconductor device 1 and the heat sink 2A are in direct contact with each other. Thus, the thermal stress to be imposed, on the adhesive material, between the rear surface 1S2 of the power semiconductor device 1 and the surface 2AS of the heat sink 2A will be less than in the conventional power modules 101P, 102P, and 103P even if there is a temperature distribution in the rear surface 1S2 and/or in the surface 2AS. This improves the reliability of the power semiconductor device, thereby achieving long-term reliability of the power module.

Second Preferred Embodiment

Figure 2:
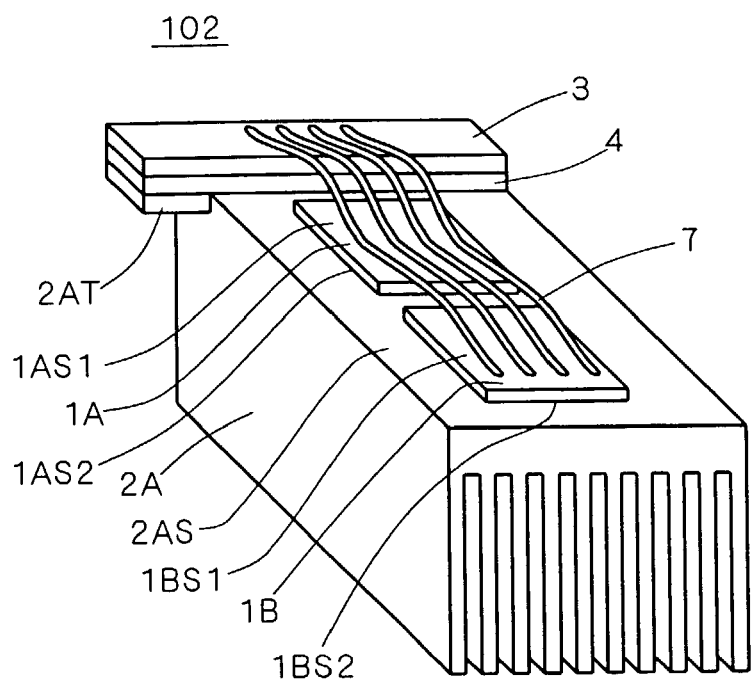
FIG. 2 is a schematic external view of a power module according to a second preferred embodiment.

FIG. 2 is a schematic external view of a power module 102 according to a second preferred embodiment. As shown in FIG. 2, the power module 102 comprises a free-wheeling diode 1A and an IGBT 1B, serving in a pair as the aforementioned power semiconductor device 1; the heat sink 2A; the electrode 3; the insulating layer 4; and the wires 7. Components similar to those previously described are denoted by the same reference numerals and they are considered to be supported by the foregoing description.

The free-wheeling diode 1A has a front surface 1AS1 and a rear surface 1AS2 corresponding to the aforementioned front and rear surfaces 1S1 and 1S2, respectively and also has a front electrode and a rear electrode (not shown).

Similarly, the IGBT 1B has a front surface 1BS1 and a rear surface 1BS2 corresponding to the aforementioned front and rear surfaces 1S1 and 1S2, respectively and also has a front electrode and a rear electrode (not shown)

Specifically, the heat sink 2A of the power module 102 is made of a conductive material such as an alloy of copper and molybdenum as above described. The diode 1A and the IGBT 1B are disposed directly on the heat sink 2A with their rear surfaces 1AS2 and 1BS2 in face-to-face contact with the front surface 2AS of the heat sink 2A. Further, the diode 1A and the IGBT 1B are bonded onto the heat sink 2A with a conductive adhesive material such as solder. This provides electrical connections between the rear electrodes of the diode 1A and the IGBT 1B through solder and the conductive heat sink 2A. On the other hand, the front electrodes of the diode 1A and the IGBT 1B are electrically connected to the electrode 3 by the wires 7, for example.

In this power module 102, the heat sink 2A having conductivity serves as an electrode. This reduces the numbers of electrodes 3 and insulating layers 4 and thereby allows the power module to be made lighter and smaller.

The heat sink 2A of the power module 102 has a protrusion 2AT that protrudes through the front surface 2AS, and both the insulating layer 4 and the electrode 3 extend over the protrusion 2AT. The protrusion 2AT of the conductive heat sink 2A and the electrode 3 on the protrusion 2AT can be utilized as a terminal of the power module 102.

Figure 34:
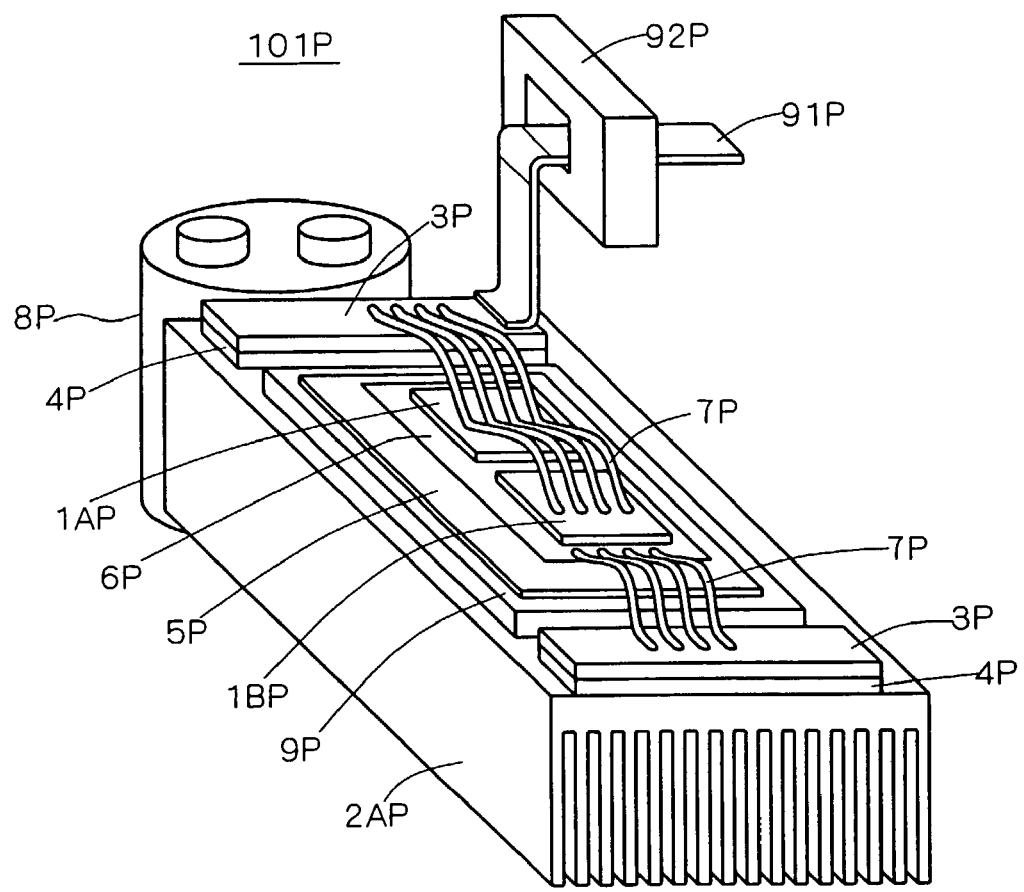
FIG. 34 is a schematic external view of a first conventional power module.
Figure 35:
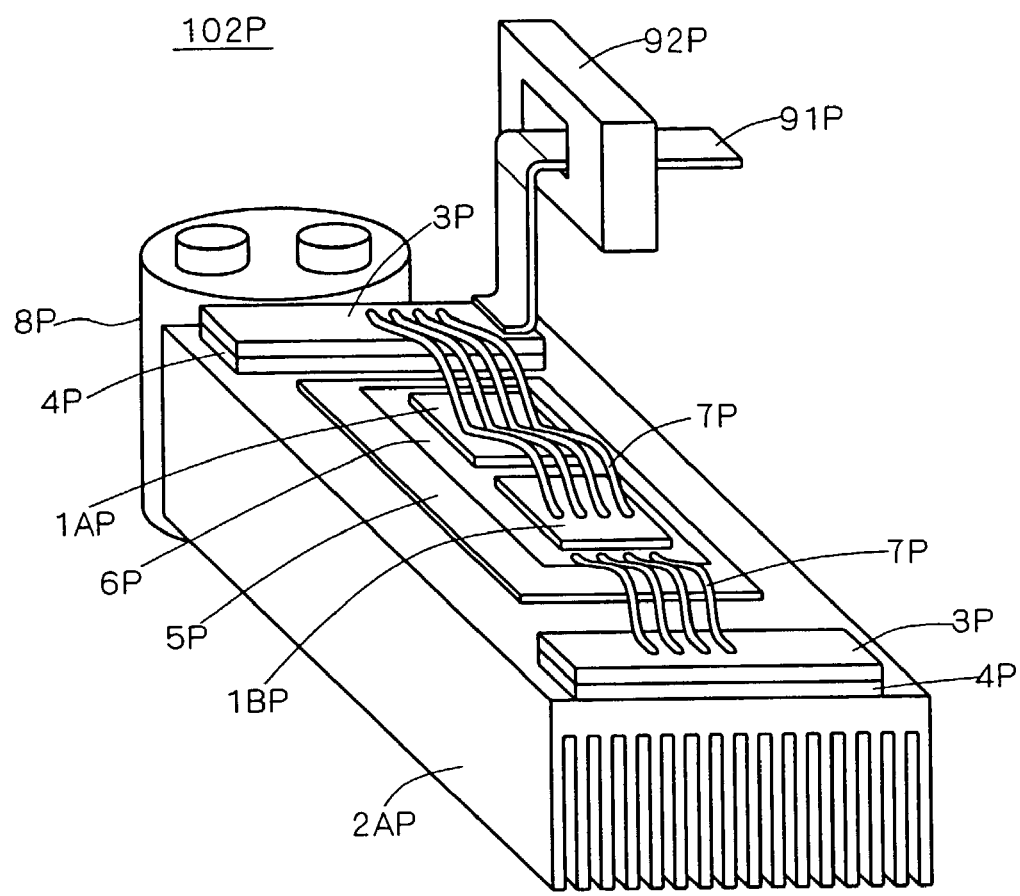
FIG. 35 is a schematic external view of a second conventional power module.
Figure 36:
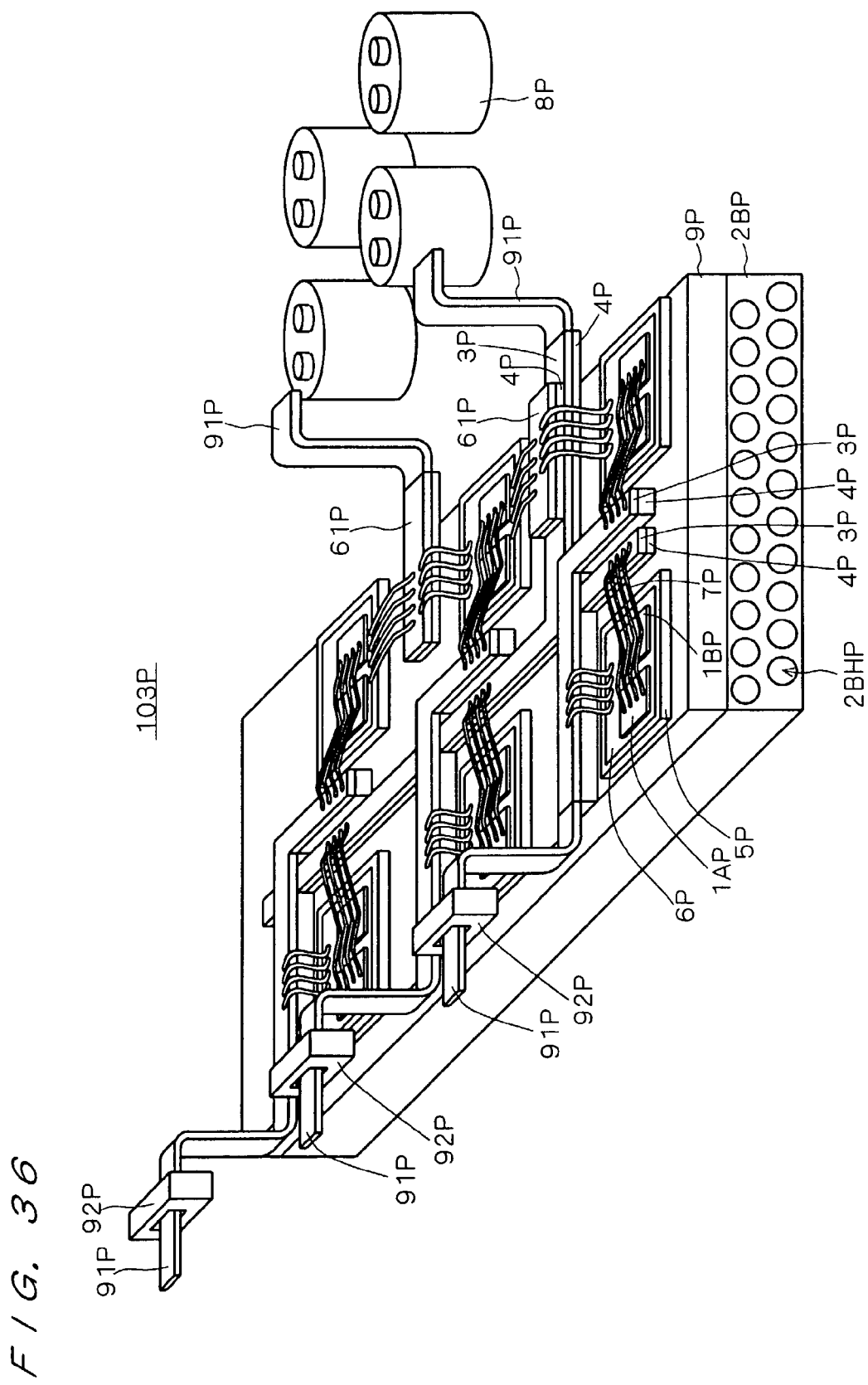
FIG. 36 is a schematic external view of a third conventional power module.

The power module 102 is principally applied in such a circuit configuration that the rear electrodes of a plurality of power semiconductor devices are at the same potential. Alternatively, it is also possible to mount a plurality of power semiconductor devices whose rear electrodes are at different potentials through the formation of an insulating substrate with conductive layers, such as copper foils (corresponding to the conventional insulating substrate 5P in FIG. 34), between the heat sink 2A and the power semiconductor devices.

Third Preferred Embodiment

Figure 3:
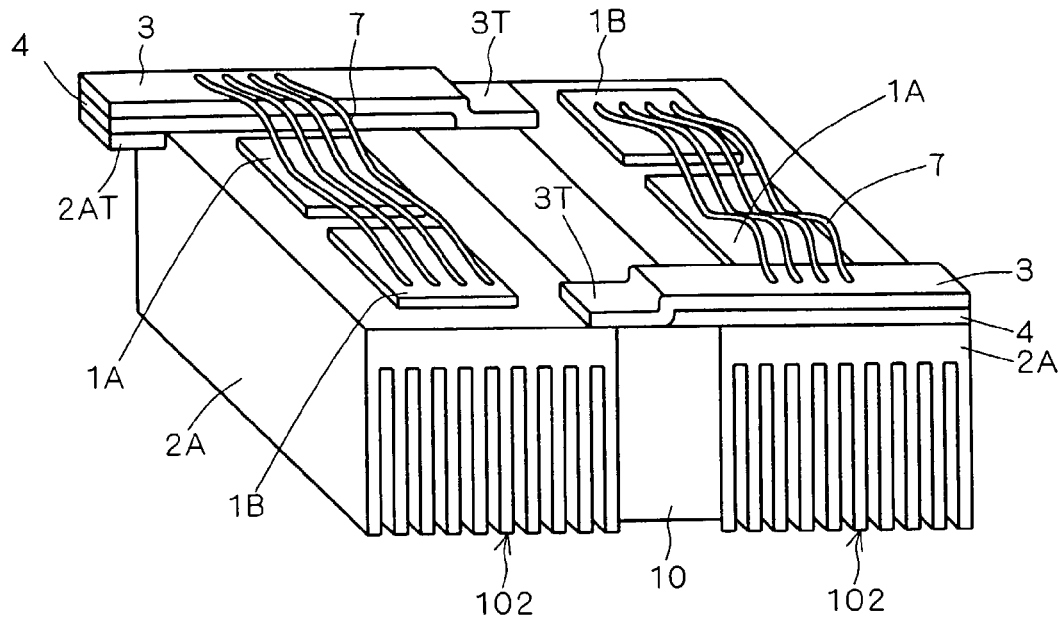
FIG. 3 is a schematic external view of a power module according to a third preferred embodiment.

FIG. 3 is a schematic external view of a power module 103 according to a third preferred embodiment. The power module 103 has such a configuration that the two power modules 102 are coupled together through an insulating member 10. The insulating member 10 may be an epoxy resin, injection molded plastic, or the like.

In the power module 103, the electrode 3 of each power module 102 extends to the other power module 102 and is electrically connected to (e.g., soldered to) the heat sink 2A of the other power module 102 (cf. protrusions 3T).

The power module 103 can easily be produced since its circuit configuration is such that the two prepared power modules 102 are merely combined together. The use of the compact and lightweight power modules 102 allows a reduction in the size and weight of the power module 103. Alternatively, three or more power modules 102 may be combined.

The diodes 1A and the heat sinks 2A may directly be connected with each other by the wires 7 without the electrodes 3 therebetween. Thus, the electrodes 3 and the like can be eliminated from the power module.

Fourth Preferred Embodiment

Figure 4:
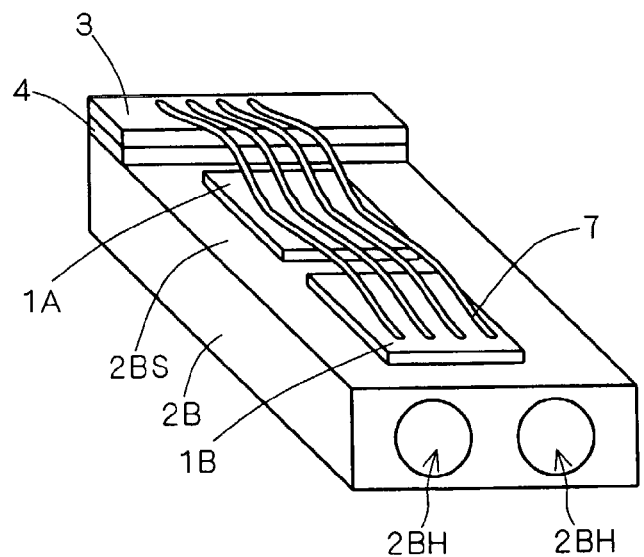
FIG. 4 is a schematic external view of a power module according to a fourth preferred embodiment.

FIG. 4 is a schematic external view of a power module 104 according to a fourth preferred embodiment. As shown in FIG. 4, the power module 104 comprises the freewheeling diode 1A, the IGBT 1B, a conductive heat sink 2B, the electrode 3, the insulating layer 4, and the wires 7.

The heat sink 2B is made of the same material as the aforementioned conductive heat sink 2A and has a plane surface 2BS corresponding to the above surface 2AS. On the surface 2BS, there are disposed the diode 1A, the IGBT 1B, and the insulating layer 4.

Specifically, the heat sink 2B of the power module 104 has two through holes 2BH as passages of a cooling medium. The through holes 2BH are located equally away from the surface 2BS; in other words, they are horizontally aligned as shown in FIG. 4. Each of the through holes 2BH is so configured as to pass under the diode 1A and the IGBT 1B. Alternatively, there may be one or not less than three through holes 2BH.

By passing a cooling medium such as gas (e.g., air, sulfur hexafluoride ($SF_6$), or carbonic acid gas) or liquid (e.g., water or oil) through the through holes 2BH, the power module 104 forcefully cools down the heat sink 2B and hence the diode 1A and the IGBT 1B. This considerably improves the cooling capability. As a result, the limits on the amount of current, which have been placed in the conventional power modules 101P, 102P, and 103P to ensure reliability, can be relaxed or lifted. Also, the heat sink and hence the power module can be made lighter and smaller.

First Example of Modification in Fourth Preferred Embodiment

Figure 5:
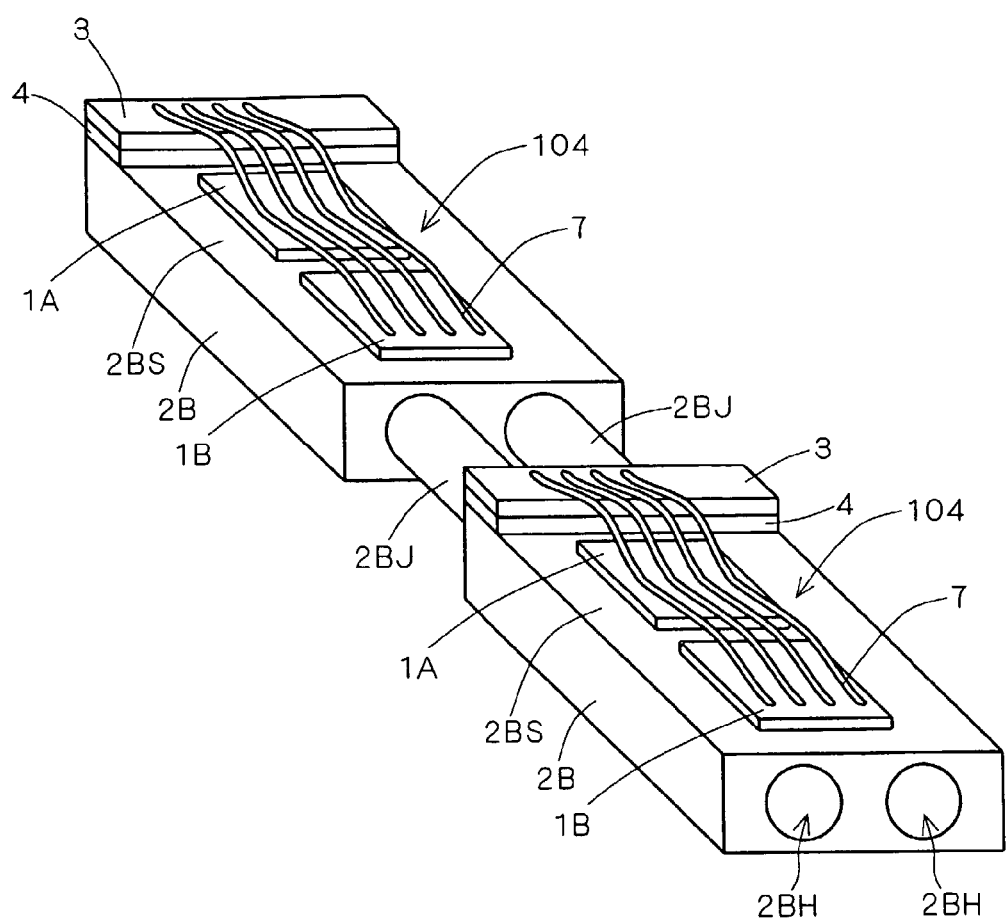
FIG. 5 is a schematic external view of a power module as a first example of modification in the fourth preferred embodiment.

FIG. 5 is a schematic external view of a power module 104A as a first example of modification in the fourth preferred embodiment. As shown in FIG. 5, the power module 104A comprises the two power modules 104 described above. Those power modules 104 are coupled together by connecting the through holes 2BH in the heat sinks 2B by pipes 2BJ.

(i) When both the heat sinks 2B are set at the same potential; i.e., when the rear electrodes of the diodes 1A and the like on both the heat sinks 2B are set at the same potential, at least either the pipes 2BJ or the cooling medium is made of a conductive material or substance (which is hereinafter referred to as "conductive coupling"). On the other hand, (ii) when the heat sinks 2B are insulated from each other; i.e., when the diodes 1A and the like on the heat sinks 2B are insulated from each other, both the pipes 2BJ and the cooling medium are made of insulating materials or substances (which is hereinafter referred to as "insulative coupling").

(iii) When the aforementioned insulating substrate 5P (and the copper foils 6P) is provided between the heat sinks 2B and the diodes 1A (cf. FIG. 34) in the above case (i) where at least either the pipes 2BJ or the cooling medium is made of a conductive material or substance, the diodes 1A and the like on the heat sinks 2B can be insulated from each other as in the above case (ii). Conversely, the aforementioned (i) conductive and (ii) insulative coupling eliminates the need for using the insulating substrate 5P and the like.

Alternatively, three or more power modules 104 may be coupled together by the pipes 2BJ for the formation of the power module 104A. At this time, for conductive coupling, a pump (not shown) to pass a cooling medium is provided for each single group which is formed of a plurality of power modules 104 of the same potential. For insulative coupling, on the other hand, only a single pump is provided for the whole power module 104A.

Second Example of Modification in Fourth Preferred Embodiment

Figure 6:
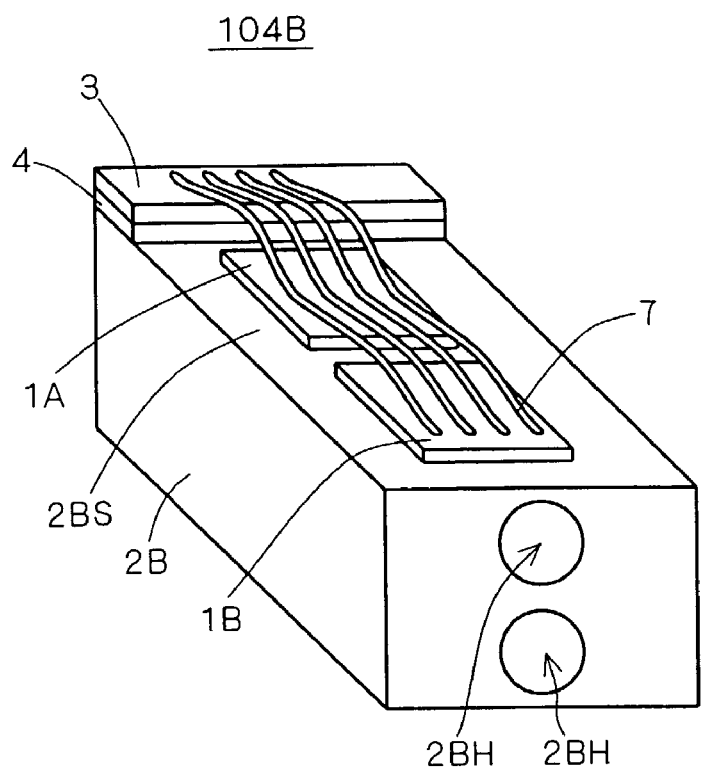
FIGS. 6 and 7 are schematic external views of a power module as a second example of modification in the fourth preferred embodiment.

FIG. 6 is a schematic external view of a power module 104B as a second example of modification in the fourth preferred embodiment. In the power module 104B, the two through holes 2BH are located differently away from the surface 2BS; in other words, the through holes 2BH are vertically aligned as shown in FIG. 6.

Figure 7:
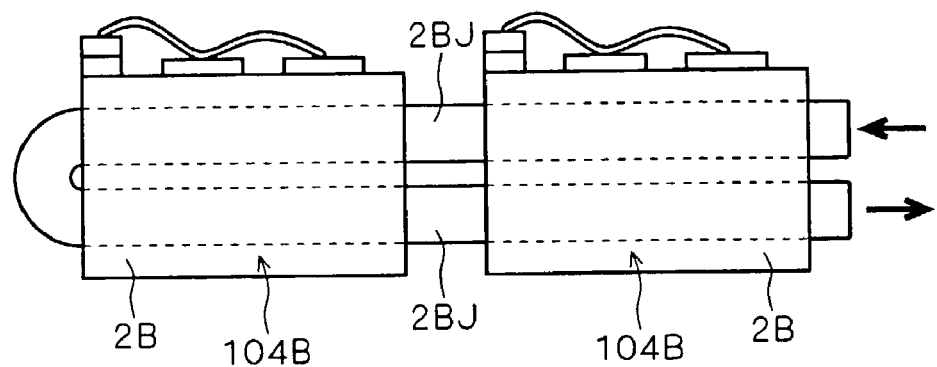

As is the case for the aforementioned power module 104A, the circuit configuration may be such that a plurality of power modules 104B are coupled together by connecting the through holes 2BH by the pipes 2BJ (see FIG. 7). At this time, the upper through holes 2BH are connected with each other and the lower through holes 2BH are connected with each other by the pipes 2BJ. Specifically, the pipes 2BJ are installed such that the cooling medium first enters and flows through the upper through holes 2BH which are closer to the diodes 1A and the IGBTs 1B, and then makes a turn, flowing to the lower through holes 2BH. This accommodates variations in the temperature of the cooling medium through the heat sinks 2B as compared with those in the above power module 104, thereby improving uniformity in cooling capability.

Third Example of Modification in Fourth Preferred Embodiment

Figure 8:
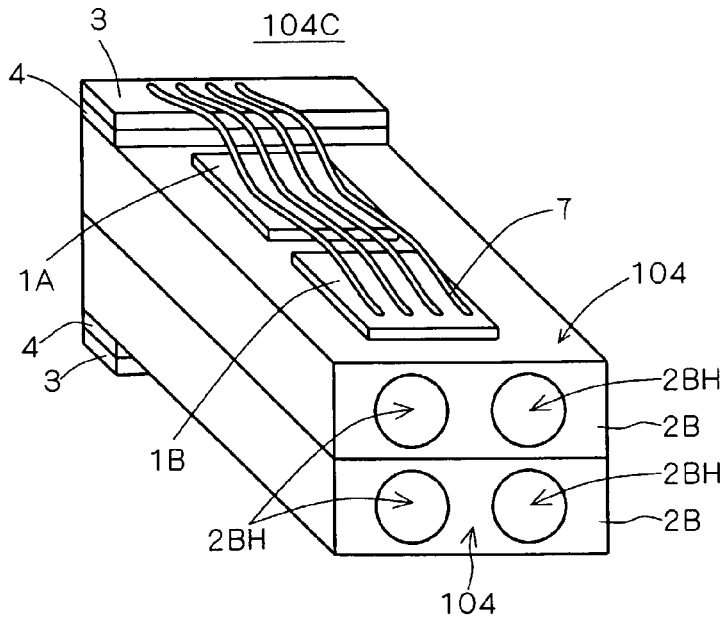
FIG. 8 is a schematic external view of a power module as a third example of modification in the fourth preferred embodiment.

FIG. 8 is a schematic external view of a power module 104C as a third example of modification in the fourth preferred embodiment. As shown in FIG. 8, the power module 104C comprise the two power modules 104 described above. The power modules 104 are located so that their surfaces on the side opposite from the surfaces 2BS of the heat sinks 2B are in contact with each other.

Fourth Example of Modification in Fourth Preferred Embodiment

Figure 9:
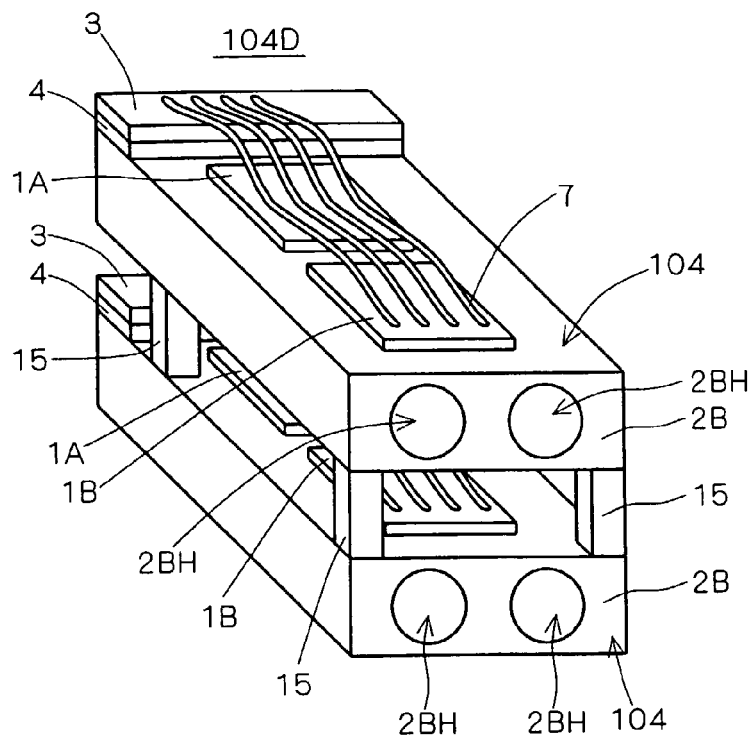
FIG. 9 is a schematic external view of a power module as a fourth example of modification in the fourth preferred embodiment.

FIG. 9 is a schematic external view of a power module 104D as a fourth example of modification in the fourth preferred embodiment. As shown in FIG. 9, the power module 104D comprises the two power modules 104 described above. Those power modules 104 are stacked one above the other through supporting members 15. At this time, (i) both the heat sinks 2B can be set at the same potential when at least one of the supporting members 15 is made of a conductive material such as a metal, and (ii) they can be insulated from each other when all the supporting members 15 are made of insulating materials such as resins.

Fifth Preferred Embodiment

Figure 10:
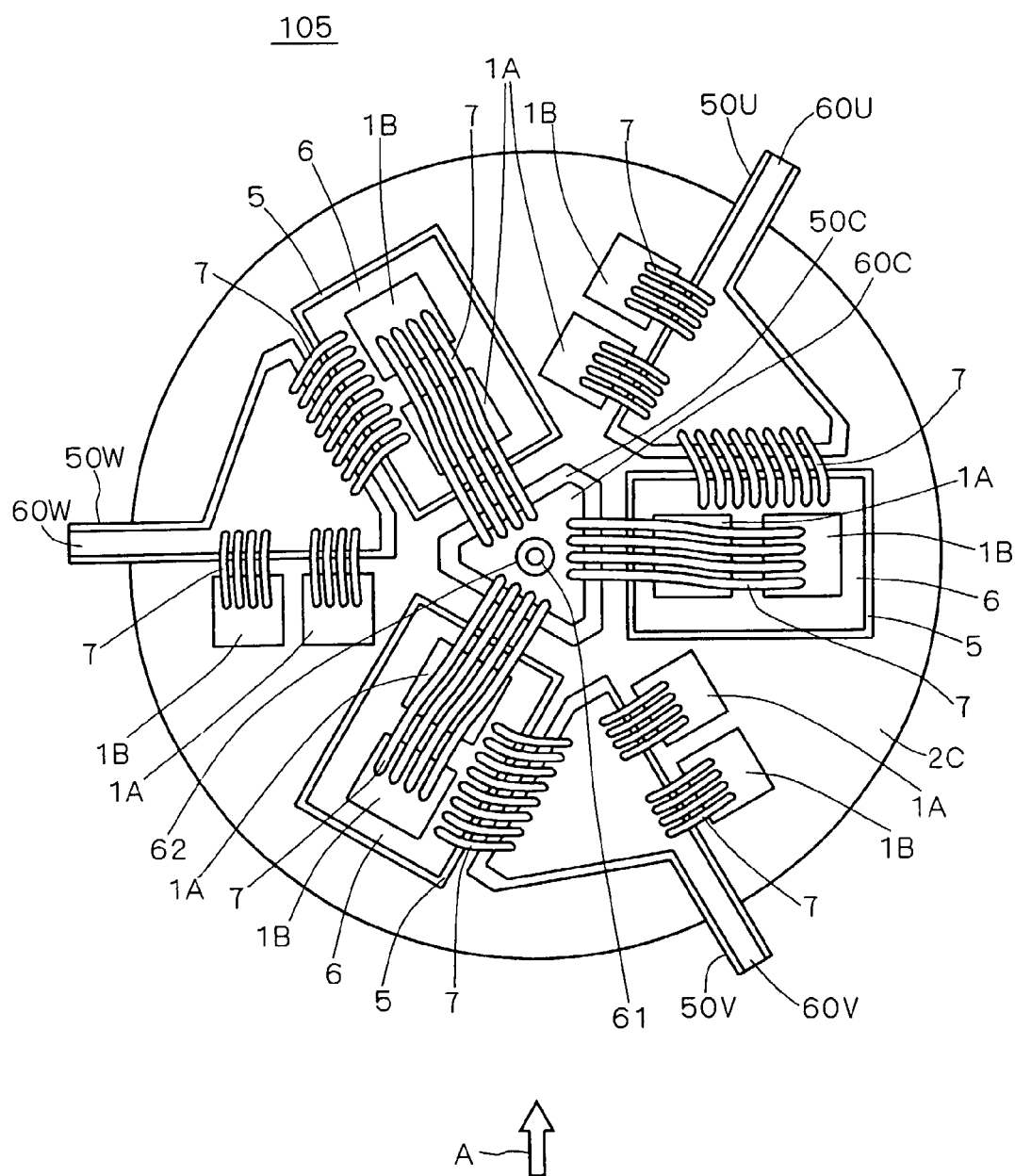
FIGS. 10 and 11 are schematic external views of a power module according to a fifth preferred embodiment.
Figure 11:
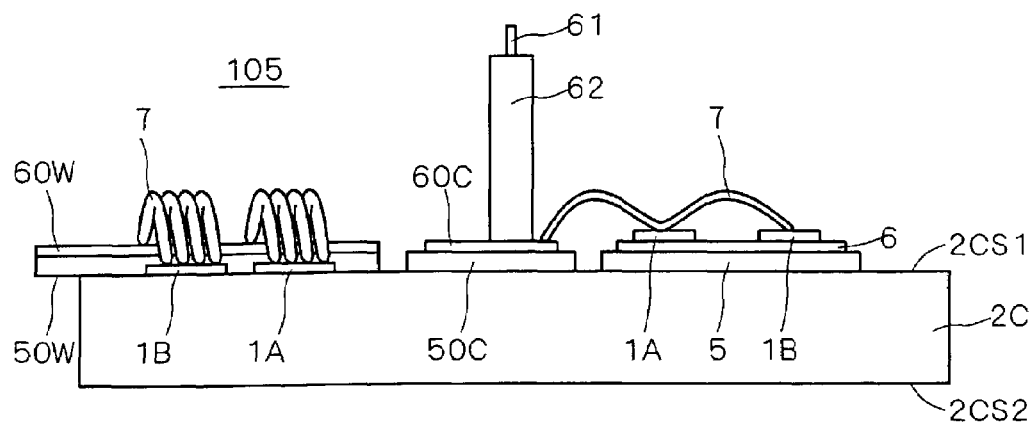
Figure 12:
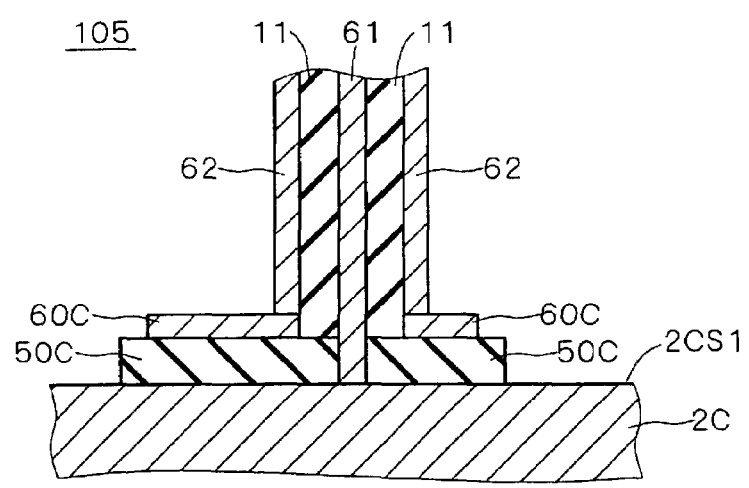
FIG. 12 is a schematic longitudinal sectional view of the power module according to the fifth preferred embodiment.

FIGS. 10 and 11 are schematic external views (top and side views) of a power module 105 according to a fifth preferred embodiment. Specifically, FIG. 11 is an external view of the power module 105 as viewed from a direction of the arrow A in FIG. 10. For the sake of simplicity, part of the components are not illustrated in FIG. 11. FIG. 12 is a schematic longitudinal sectional view of the power module 105.

The power module 105 is a so-called three-phase voltage type power transducer. The power transducer includes both an inverter and a converter. In each phase of the power transducer, upper and lower arms, forming in a pair a single arm, are connected in series via an output terminal, and more specifically, the upper arm is connected between the high potential side (corresponding to a second voltage) and the output terminal, and the lower arm is connected (or grounded) between the output terminal and the low potential side (corresponding to a first voltage). In terms of equivalent circuits, the power transducer is a polyphase bridge circuit; in this case, the module 105 corresponds to a three-phase bridge circuit.

The power module 105 comprises a cylindrical heat sink 2C having opposed circular main surfaces (surfaces) 2CS1 and 2CS2. The heat sink 2C has conductivity.

On one main surface 2CS1 of the heat sink 2C, there are disposed three insulating substrates 50U, 50V, and 50W formed for example of ceramic plates. Each of the insulating substrates 50U, 50V, and 50W has main surfaces, on both of which copper foils or the like are placed, and is bonded onto the main surface 2CS1 with solder, for example. The above copper foils which face the heat sink 2C are provided for good adhesion between the insulating substrates 50U, 50V, 50W and the heat sink 2C. The copper foils on the other side of the insulating substrates 50U, 50V, and 50W, which do not face the heat sink 2C, form electrodes 60U, 60V, and 60W, respectively, to be the output terminals of the power transducer. The electrodes 60U, 60V, and 60W may be made of other conductive materials than copper foils.

The insulating substrates 50U, 50V, and 50W are about equally spaced on a circumference which is concentric with that of the circular main surface 2CS1, i.e., on a circumference about the center of the main surface 2CS1. In other words, the insulating substrates 50U, 50V, and 50W are angularly spaced at regular intervals (in this case, 120° from each other) with respect to the center of the circular main surface 2CS1 and they are also equally away from the above center.

Further, three power semiconductor devices, each consisting of one diode 1A and one IGBT 1B, are disposed directly on the main surface 2CS1, adjacent to the insulating substrates 50U, 50V, and 50W. Those power semiconductor devices are about equally spaced on a circumference concentric with that of the circular main surface 2CS1 so that they are located between each of the insulating substrates 50U, 50V, and 50W. Specifically, the rear electrodes of such diodes 1A and IGBTs 1B are directly bonded onto the main surface 2CS1 with solder, for example. The front electrodes of the diodes 1A and the IGBTs 1B, on the other hand, are electrically connected to the electrodes 60U, 60V, and 60W by the wires 7, for example. Disposed directly on the heat sink 2C as above described, each of the three pairs of diodes 1A and IGBTs 1B forms one lower arm of the power transducer.

On the main surface 2CS1, there are further disposed the insulating substrates 5, which are formed for example of ceramic plates, in close proximity to the insulating substrates 50U, 50V, and 50W. Those insulating substrates 5 are equally spaced on a circumference concentric with that of the circular main surface 2CS1 so that they are located between each of the insulating substrates 50U, 50V, and 50W. Each of the insulating substrates 5 has main surfaces, on both of which copper foils or the like are placed, and is boded onto the main surface 2CS1 with solder, for example. The copper foils which do not face the heat sink 2C form conductive layers 6.

On each of the conductive layers 6 formed on the insulating substrates 5, a diode 1A and an IGBT 1B are disposed. The diode 1A and the IGBT 1B are bonded together with solder for example so that their rear electrodes are in face-to-face contact with the conductive layer 6. The adjacent conductive layer 6 and electrode 60U, 60V, or 60W are connected by the wires 7, for example. Disposed through the insulating substrate 5 over the heat sink 2C, each of the three pairs of diodes 1A and IGBTs 1B forms one upper arm of the power transducer.

According to such disposition of the diodes 1A and the like, the three arms of the power module 105 (each consisting of the upper and lower arms) are angularly spaced at regular intervals with respect to the center (where an electrode 61 is disposed as will be described later) of the circular main surface 2CS1 of the heat sink 2C.

On the circular main surface 2CS1, an insulating substrate 50C formed for example of a ceramic plate is further disposed around the center of its circle. The insulating substrate 50C has main surfaces, on both of which copper foils or the like are placed, and is bonded onto the main surface 2CS1 with solder, for example. The copper foil which does not face the heat sink 2C forms a conductive layer 60C. The front electrodes of the diode 1A and the IGBT 1B on each of the insulating substrates 5 are electrically connected to the conductive layer 60C by the wires 7, for example. The shapes of the insulating substrate 50C, the conductive layer 60C, and the like are not limited to those illustrated in the figures.

Specifically, a rod-shaped electrode 61 for example extends out through the insulating substrate 50C, from approximately the center of the circular main surface 2CS1 where the diodes 1A and the like are disposed (see FIG. 12). The electrode 61 is electrically connected to the heat sink 2C. There is further disposed an electrode 62 in electrical connection with the conductive layer 60C. The electrode 62 is for example a cylindrical electrode into which the electrode 61 is inserted. The electrodes 61 and 62 are insulated from each other with an insulating member 11 therebetween. Further, the electrodes 61 and 62 form a so-called coaxial line. In the power module 105, the electrode 61 is regarded as the "first electrode" and the electrode 62 as the "second electrode".

With such a configuration, the power module 105 forms a power transducer having five electrodes 60U, 60V, 60W, 61, and 62.

FIG. 13, corresponding to FIG. 10, is a schematic diagram illustrating through holes 2CH in the heat sink 2C. For the sake of simplicity, the insulating substrates 5 and the like in FIG. 10 are not illustrated in FIG. 13. As shown, the heat sink 2C has three through holes 2CH, each in the general shape of a ring and concentric with the circumference of the main surface 2CS1 (shown by different broken lines). By passing a cooling medium through each of the through holes 2CH, the power module 105 is cooled down. The number of through holes 2CH is not limited to three, but those holes 2CH should preferably be formed under the diodes 1A and the IGBT 1B which are heating elements. Alternatively, the through holes 2CH may take a spiral form for example, instead of being shaped like rings. Further, as is the case for the power module 104B (cf. FIG. 6), the through holes 2CH may be aligned vertically between the main surfaces 2CS1 and 2CS2.

According to the power module 105, as have been described, the three arms of the power transducer are about equally spaced on the circumference concentric with that of the main surface to surround the above coaxial line. Thus, the wiring between the electrodes 61, 62 and each arm can be installed in a similar manner. This reduces variations in the outputs from those arms, and variations in voltage on the low potential side, thereby offering considerable resistance to malfunctions. As a result, a highly reliable power transducer can be provided.

Example of Modification in Fifth Preferred Embodiment

While in the power module 105, all the diodes 1A and the like are disposed on the main surface 2CS1 of the heat sink 2C, part of them may be disposed on the other main surface 2CS2 of the heat sink 2C. For example, the three insulating substrates 5 and the components to be disposed thereon may be disposed on the main surface 2CS2 and predetermined wiring may be installed therefor.

Sixth Preferred Embodiment

FIG. 14 is a schematic external view of a power module 111 according to a sixth preferred embodiment. In the power module 111 as shown in FIG. 14, the diode 1A, the IGBT 1B, and a capacitor 20 for smoothing direct current are directly disposed on the surface 2BS of the aforementioned conductive heat sink 2B having the through holes 2BH. The diode 1A and the IGBT 1B form a "first power semiconductor device".

As has been described, the diode 1A has main surfaces (front surface 1AS1 and rear surface 1AS2) corresponding to the main surfaces of the silicon substrate, and more specifically, the front surface 1AS1 has a front electrode therein and the rear surface 1AS2 has a rear electrode therein. Similarly in the IGBT 1B, a front electrode is formed in the front surface 1BS1 and a rear electrode in the rear surface 1BS2. For the sake of simplicity, the details of the front electrodes and the rear electrodes of the diode 1A and the IGBT 1B are not illustrated in FIG. 14.

Unlike the conventional cylindrical capacitor 8P, the capacitor 20 is a plate capacitor with two opposed main surfaces 20S1 and 20S2. One main surface (hereinafter referred to as "rear surface") 20S2 of the plate capacitor has an electrode therein (not shown: hereinafter referred to as "rear electrode") and the other main surface (hereinafter referred to as "front surface") 20S1 has another electrode therein (not shown: hereinafter referred to as "front electrode").

The rear electrodes of the diode 1A, the IGBT 1B, and the capacitor 20 are bonded to the heat sink 2B with solder, for example. This provides electrical connections between each of the rear electrodes through the conductive heat sink 2B. On the other hand, the front electrodes (which do not face the heat sink 2B) of the diode 1A, the IGBT 1B, and the capacitor 20 are connected by the wires 7. Alternatively, electrical connections may be established between each of the front electrodes by application of pressure or a conductive adhesive.

The power module 111 achieves the following effects. First of all, it is compact in size, lightweight, and highly reliable.

More specifically, since the diode 1A, the IGBT 1B, and the capacitor 20 are disposed directly on the heat sink 2B, the power module 111 can be made smaller than the conventional power modules 101P, 102P, and 103P wherein those components are provided independently. Further, the heat radiating action of the heat sink 2B inhibits not only heat generation in the diode 1A and the IGBT 1B but also the temperature rise in the capacitor 20. This allows miniaturization of the capacitor 20, lower inductance, and an increase in longevity.

Disposing the diode 1A, the IGBT 1B, and the capacitor 20 directly on the heat sink 2B also reduces the length of wiring between the diode 1A or the IGBT 1B and the capacitor 20 shorter than in the conventional power modules 101P, 102P, and 103P. Especially because the heat sink 2B has conductivity, the electrical connections among the diode 1A, the IGBT 1B, and the capacitor 20 can be established by the shortest path through the heat sink 2B. The power module 111 can thus have lower circuit inductance than the conventional power modules 101P, 102P, and 103P. This reduces overshoot voltage at a switching operation of the diode 1A and the IGBT 1B, resulting in a reduction in withstand voltage and loss of the diode 1A and the IGBT 1B. Further, the above short wiring length reduces the occurrence of electromagnetic noise.

According to the power module 111, the heat sink 2B having conductivity can be used as an electrode. This reduces the number of components such as wires that were necessary for insulative heat sinks and eliminates processes related to the formation of such components.

The cooling capability of the heat sink 2B can be improved by passing a cooling medium through the through holes 2BH in the heat sink 2B.

First Example of Modification in Sixth Preferred Embodiment

The aforementioned effects can also be achieved by replacing the heat sink 2B with the conductive heat sink 2A with a fin structure as in a power module 111A in FIG. 15.

Second Example of Modification in Sixth Preferred Embodiment

Figure 16:
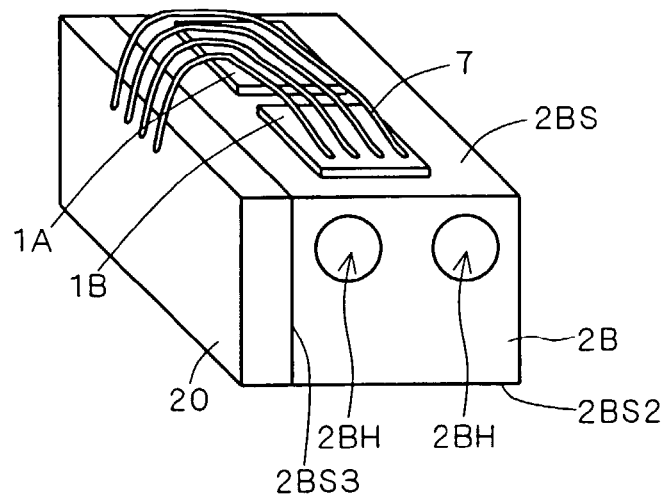
FIG. 16 is a schematic external view of a power module as a second example of modification in the sixth preferred embodiment.

The capacitor 20, and the diode 1A and the IGBT 1B may be disposed on different surfaces of the heat sink 2B. More specifically, as in a power module 111B in FIG. 16, the diode 1A and the IGBT 1B may be disposed on the surface 2BS of the heat sink 2B and the capacitor 20 may be disposed on another surface (side face) 2BS3 adjacent to the surface 2BS. Or the capacitor 20 may be disposed on the surface 2BS2 opposed to the surface 2BS. Such a configuration is also applicable to the case of using the heat sink 2A.

This power module 111B can be made lighter and smaller than the power module 111. Further, less interference occurs between heat radiation in the diode 1A and the IGBT 1B and that in the capacitor 20, which improves heat radiating performance of the power module.

Seventh Preferred Embodiment

Figure 17:
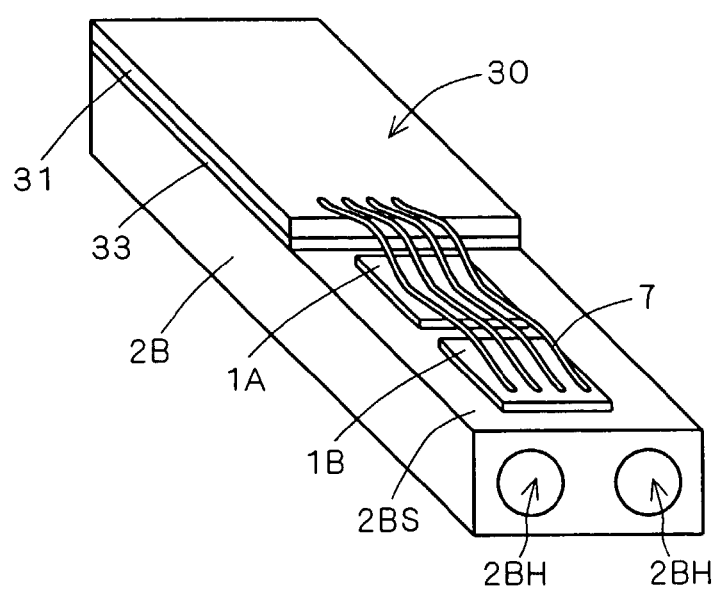
FIG. 17 is a schematic external view of a power module according to a seventh preferred embodiment.

FIG. 17 is a schematic external view of a power module 112 according to a seventh preferred embodiment of the present invention. As is evident from the comparison between FIG. 17 and FIG. 14 described earlier, the power module 112 comprises a capacitor dielectric 33 and a capacitor electrode 31, instead of the capacitor 20 (cf. FIG. 14). More specifically, with the capacitor dielectric 33 sandwiched between the conductive heat sink 2B and the capacitor electrode 31, the heat sink 2B, the capacitor dielectric 33, and the capacitor electrode 31 constitute a plate capacitor 30 corresponding to the aforementioned capacitor 20. The power module 112 is in all other aspects identical to the power module 111.

The capacitor electrode 31 corresponds to the front electrode of the capacitor 20 and the heat sink 2B to the rear electrode. In this power module 112, the diode 1A and the IGBT 1B can be considered to be disposed on the rear electrode of the capacitor 30.

The power module 112 achieves similar effects to those of the aforementioned power module 111.

First Example of Modification in Seventh Preferred Embodiment

Figure 18:
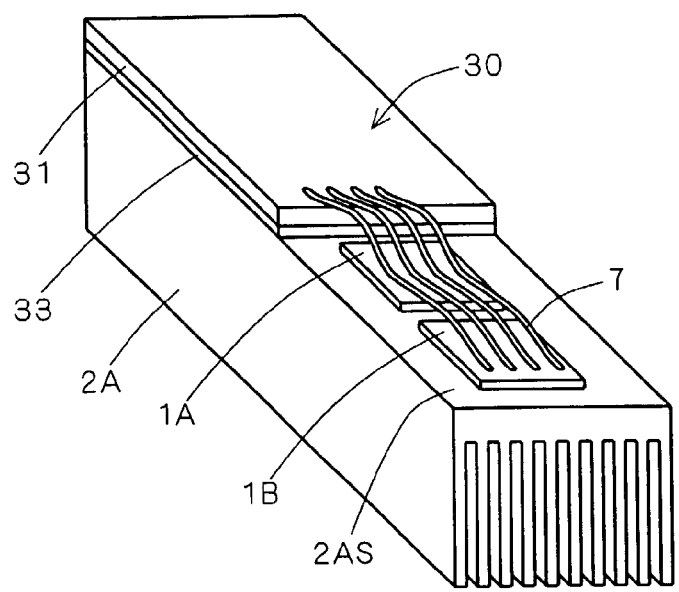
FIG. 18 is a schematic external view of a power module as a first example of modification in the seventh preferred embodiment.

The heat sink 2B may be replaced with the conductive heat sink 2A having a fin structure as in a power module 112A in FIG. 18.

Second Example of Modification in Seventh Preferred Embodiment

Figure 19:
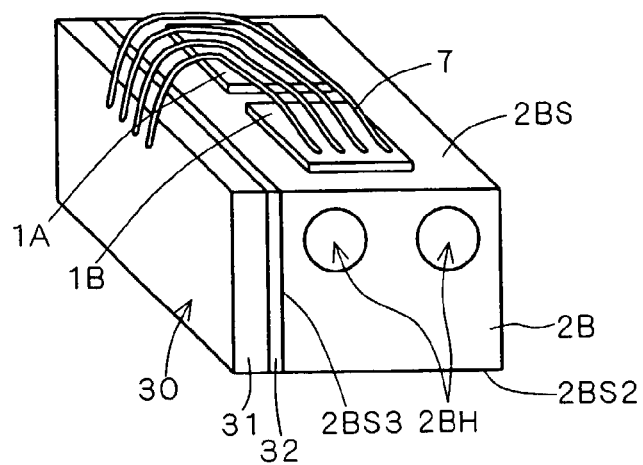
FIG. 19 is a schematic external view of a power module as a second example of modification in the seventh preferred embodiment.

FIG. 19 is a schematic external view of a power module 112B as a second example of modification in the seventh preferred embodiment. In the power module 112B, as is the case for the power module 111B (cf. FIG. 16), the capacitor dielectric 33 and the capacitor electrode 31 are disposed on either the surface 2BS2 or 2BS3 of the heat sink 2B other than the surface 2BS. Such a configuration is also applicable to the case of using the heat sink 2A. The power module 112B achieves similar effects to those of the aforementioned power module 111B.

Eighth Preferred Embodiment

Figure 20:
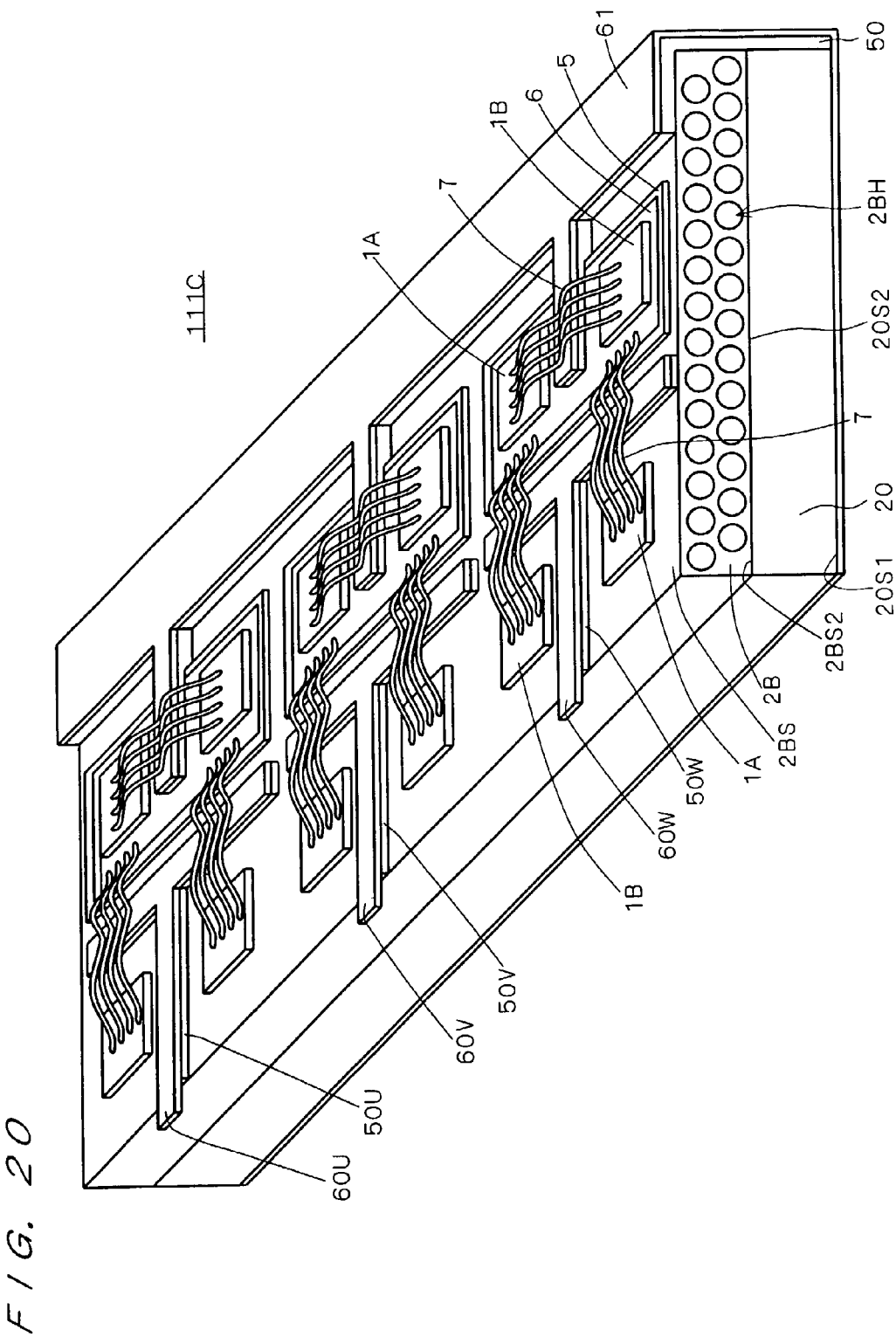
FIG. 20 is a schematic external view of a power module according to an eighth preferred embodiment.

FIG. 20 is a schematic external view of a power module 111C according to an eighth preferred embodiment. This power module 111C is a so-called three-phase voltage type power transducer.

In the power module 111C, the capacitor 20 is disposed directly on the heat sink 2B with its rear surface 20S2 in face-to-face contact with the surface 2BS2 of the heat sink 2B.

The power module 111C comprises three arms for power transducer. One diode 1A and one IGBT 1B, forming in a pair the lower arm of each arm, are both disposed directly on the surface 2BS of the heat sink 2B with their rear electrodes in face-to-face contact with the heat sink 2B. The front electrodes of, respectively, the lower-arm diode 1A and IGBT 1B are electrically connected, for example by the wires 7, to the electrode 60U, 60V, or 60W to be the output terminal of the power transducer. The electrodes 60U, 60V, and 60W are disposed through the insulating substrates (or insulating layers) 50U, 50V, and 50W, respectively, over the surface 2BS of the heat sink 2B.

On the other hand, one diode 1A and one IGBT 1B (which form a "second power semiconductor device") forming in a pair the upper arm of each arm are disposed through the insulating substrate 5 over the surface 2BS of the heat sink 2B. The rear electrodes of the upper-arm diode 1A and IGBT 1B are electrically connected to the conductive layer 6 formed on the insulating substrate 5. The conductive layers 6 are electrically connected, for example by the wires 7, to the electrodes 60U, 60V, and 60W corresponding to the respective arms. The front electrodes of the upper-arm diode 1A and IGBT 1B are electrically connected, for example by the wires 7, to the electrode 61 which is common to all the arms.

The electrode 61 extends from the surface 2BS of the heat sink 2B across the surface 20S1 of the capacitor 20 and is electrically connected to the front electrode of the capacitor 20. Further, the electrode 61 is isolated from the capacitor 20, excluding the surface electrode, and the heat sink 2B by an insulating layer 50.

In the power module 111C, the electrode 61 is the "second electrode" connected to the high potential side and the heat sink 2B is the "first electrode" connected to the low potential side.

According to the power module 111C, the diodes 1A and the IGBTs 1B of the upper arms are disposed through the insulating substrate 5 over the heat sink 2B. Thus, diodes 1A and IGBTs 1B having rear electrodes of different potentials may be disposed together on the conductive heat sink 2B for the formation of the circuit.

Example of Modification in Eighth Preferred Embodiment

Figure 21:
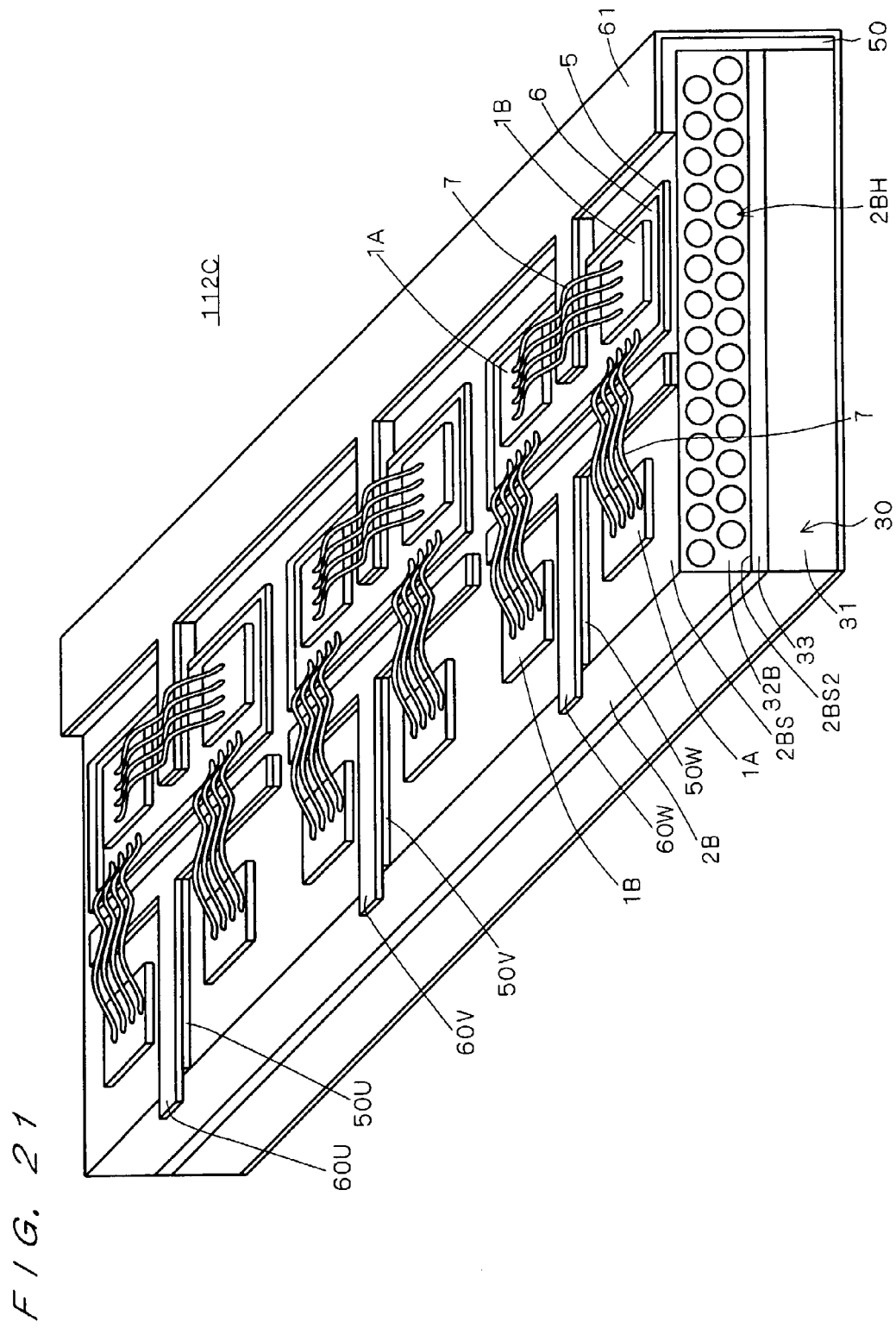
FIG. 21 is a schematic external view of a power module as an example of modification in the eighth preferred embodiment.

FIG. 21 is a schematic external view of a power module 112C as an example of modification in the eighth preferred embodiment. Like the aforementioned power module 111C, the power module 112C is a so-called three-phase voltage type power transducer.

As is evident from the comparison between FIG. 21 and FIG. 20 described earlier, the power module 112C comprises the capacitor electrode 31 and the capacitor dielectric 33 instead of the capacitor 20 in the power module 111C. Specifically, the capacitor dielectric 33, which is located in face-to-face contact with the surface 2BS2 of the heat sink 2B, is sandwiched between the heat sink 2B and the capacitor electrode 31. With such a configuration, the heat sink 2B, the capacitor dielectric 33, and the capacitor electrode 31 constitute the aforementioned plate capacitor 30. The power module 112C is in all other aspects identical to the power module 111C.

According to the power module 112C, the diodes 1A and the IGBTs 1B can be considered to be disposed on one of the electrodes of the capacitor 30. Thus, the power module 112C can achieve similar effects to those of the power module 112. Further as in the aforementioned power module 111C, the presence of the insulating substrates 5 makes it possible to dispose diodes 1A and the IGBTs 1B, whose rear electrodes are at different potentials, together on one of the electrodes of the capacitor 30.

Ninth Preferred Embodiment

Figure 22:
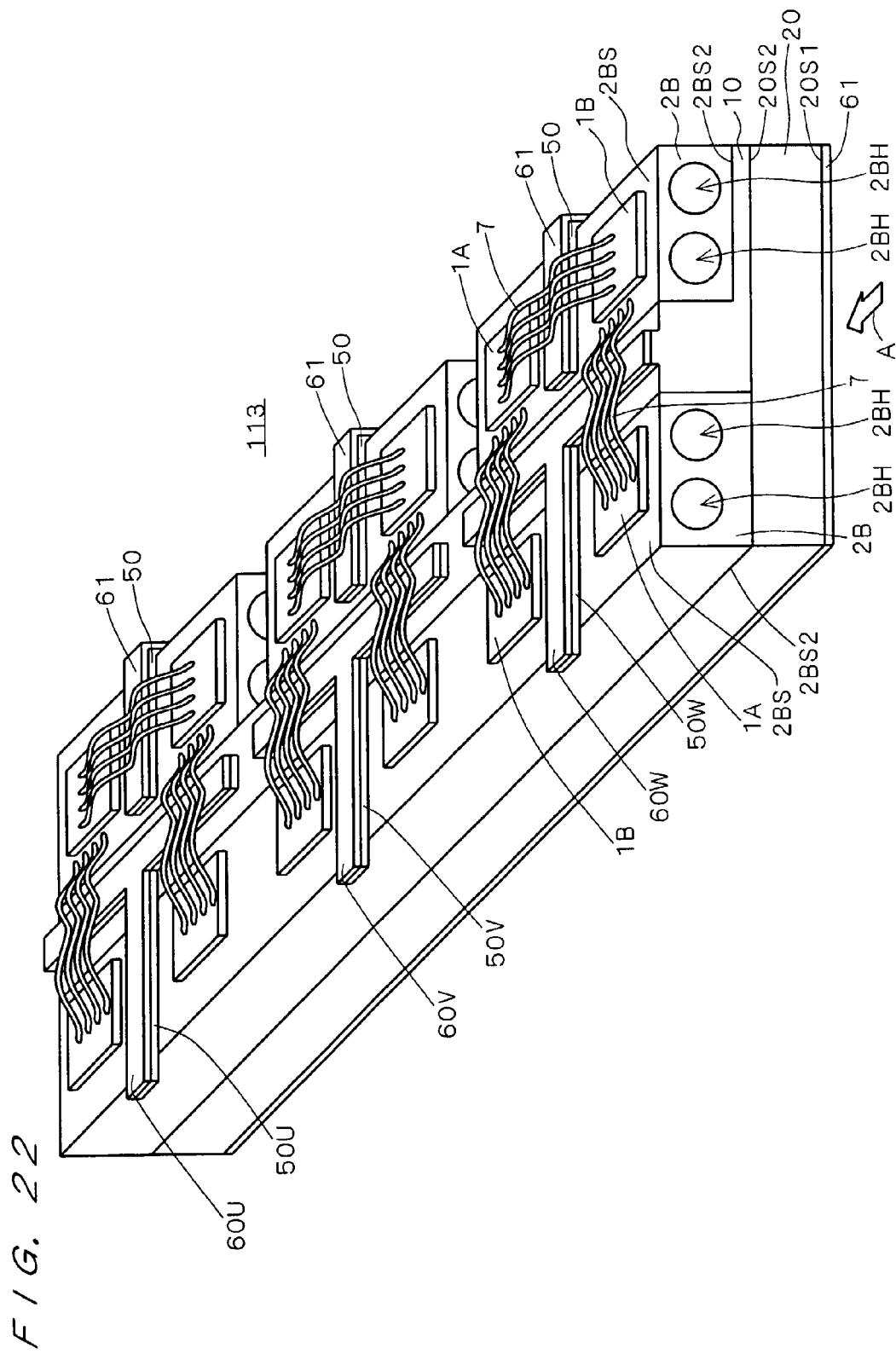
FIGS. 22 and 23 are schematic external views of a power module according to a ninth preferred embodiment.
Figure 23:
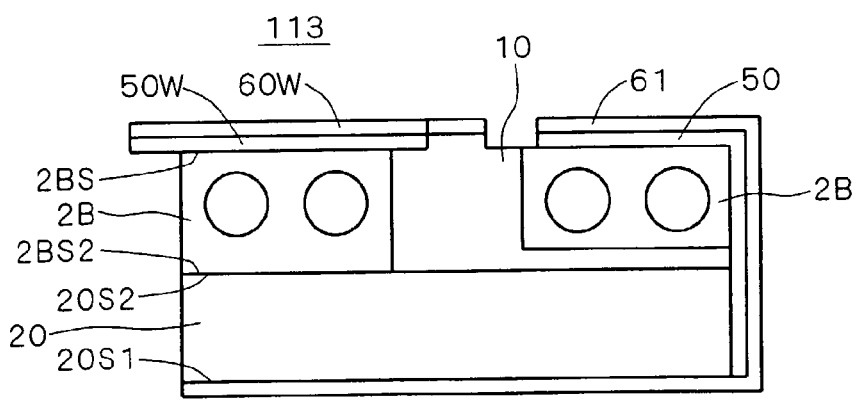

FIGS. 22 and 23 are schematic external views of a power module 113 according to a ninth preferred embodiment. FIG. 23 is an external view (side view) of the power module 113 as viewed from a direction of the arrow A in FIG. 22. For the sake of simplicity, the diodes 1A, the IGBTs 1B, and the wires 7 are not illustrated in FIG. 23. Like the aforementioned power module 111C, the power module 113 is a so-called three-phase voltage type power transducer.

In the power module 113, as is evident from the comparison between FIG. 22 and FIG. 22 described earlier, the diodes 1A and the IGBTs 1B of all the lower arms of the power transducer are disposed directly on the surface 2BS of a single lower-arm heat sink 2B. The lower-arm heat sink 2B and the capacitor 20 are provided so that the front surface 2BS2 of the lower-arm heat sink 2B and the rear surface 20S2 of the capacitor 20 are in face-to-face relationship. The rear electrodes of the lower-arm heat sink 2B and the capacitor 20 are thus in electrical contact with each other.

On the other hand, the diode 1A and the IGBT 1B of each upper arm of the power transducer are disposed directly on each upper-arm heat sink (another heat sink) 2B having conductivity and are electrically connected to the electrode 61 as in the power module 111C (cf. FIG. 20). The three upper-arm heat sinks 2B are coupled but insulated from each other (the pipes 2BJ are not illustrated in FIG. 22). They are also insulated from the rear electrodes of the lower-arm heat sink 2B and the capacitor 20 by the insulating member 10. With the insulating member 10, the four heat sinks 2B and the capacitor 20 are integrally coupled together.

The upper-arm heat sinks 2B are electrically connected to the corresponding electrodes 60U, 60V, and 60W by the wires (flexible wires) 7, for example. Especially, those wires 7 establish electrical connections between the upper arms and the lower arms, using, as relay or junction points, the portions (conductive materials) of the electrodes 60U, 60V, and 60W located above the insulating member 10.

In the power module 113, as has been described, the four heat sinks 2B are insulated from each other by the insulating member 10. Thus, unlike the above-mentioned power module 111C (cf. FIG. 20), the power module 113 can set the rear electrodes of the upper-arm diodes 1A and IGBTs 1B and those of the lower-arm diodes 1A and IGBTs 1B at different potentials without the use of the insulating substrates 5. This allows a reduction in the number of components by the number of insulating substrates 5.

In the power module 113, the upper and lower arms are broadly equivalent in construction; therefore, manufacturing cost of the power module as a whole can be reduced. This results in the provision of a low-cost power module.

Further, the wires 7 which couple the upper and lower arms together as have been described, are connected to the portions (conductive members) of the electrodes 60U, 60V, and 60W located above the insulating member 10. This inhibits deflection or the slack of those wires as compared with the case where the upper and lower arms are directly connected with each other without passing through the above conductive materials. As a result, short circuits due to the slack of the wires can be prevented.

Tenth Preferred Embodiment

Figure 24:
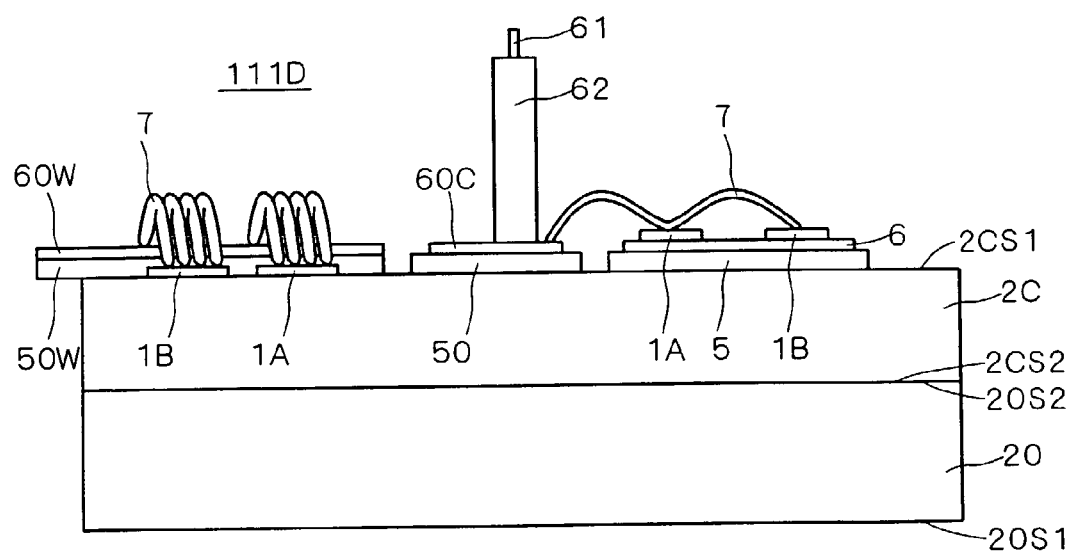
FIG. 24 is a schematic external view of a power module according to a tenth preferred embodiment.
Figure 25:
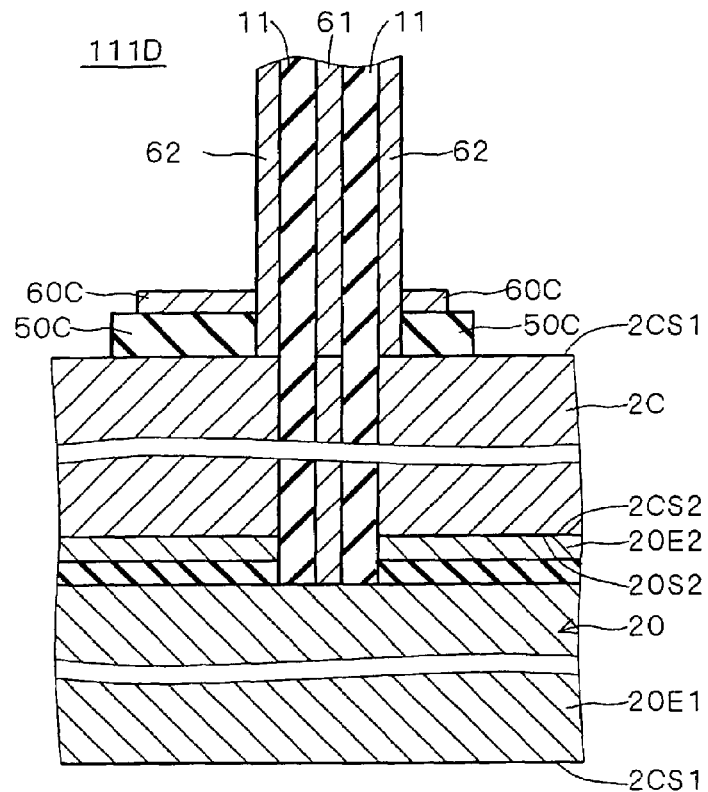
FIG. 25 is a schematic longitudinal sectional view of the power module according to the tenth preferred embodiment.

FIG. 24 is a schematic external view (side view) and FIG. 25 is a schematic longitudinal sectional view of a power module 111D according to a tenth preferred embodiment. As is evident from the comparison between FIG. 24 and FIG. 11 described earlier, the power module 111D is basically configured such that the capacitor 20 is added to the aforementioned power module 105. Since the components identical to those of the power module 105 are supported by the foregoing description, the following description concentrates on the features of the power module 111D. As in FIG. 11, part of the components are not illustrated in FIG. 24.

Each of the three lower arms of the power transducer comprises the diode 1A and the IGBT 1B which are disposed directly on the heat sink 2C, and each of the three upper arms of the power transducer comprises the diode 1A and the IGBT 1B which are disposed through the insulating substrate 5 over the heat sink 2C.

In the power module 111D, the capacitor 20 is disposed directly on the circular main surface 2CS2 of the conductive heat sink 2C. At this time, the rear surface 20S2 of the capacitor 20 is in face-to-face contact with the heat sink 2C, so there is an electrical connection between a rear electrode 20E2 of the capacitor 20 (see FIG. 25) and the heat sink 2C.

The power module 111D differs from the aforementioned power module 105 in the connection between the electrodes 61 and 62. More specifically, as shown in FIG. 25, the rod-shaped electrode 61 extends through the heat sink 2C and part of the capacitor 20 (other than a surface electrode 20E1) and is electrically connected to the front electrode 20E1 of the capacitor 20. At this time, the insulating member 11 also extends along with the electrode 61, so that the electrode 61 is insulated from the heat sink 2C and part of the capacitor 20 (other than the surface electrode 20E1). The cylindrical electrode 62, on the other hand, extends through the insulating substrate 50C and is electrically connected to the heat sink 2C.

In the power module 11D, the electrode 61 is the "second electrode" connected to the high potential side of the power transducer, and the electrode 62 is the "first electrode" connected to the low potential side.

Like the aforementioned power module 105, the power module 111D can be a highly reliable power transducer because of the arrangement of the three arms around the coaxial line. Also, it can be made lighter and smaller than the conventional power module 103P.

Example of Modification in Tenth Preferred Embodiment

Figure 26:
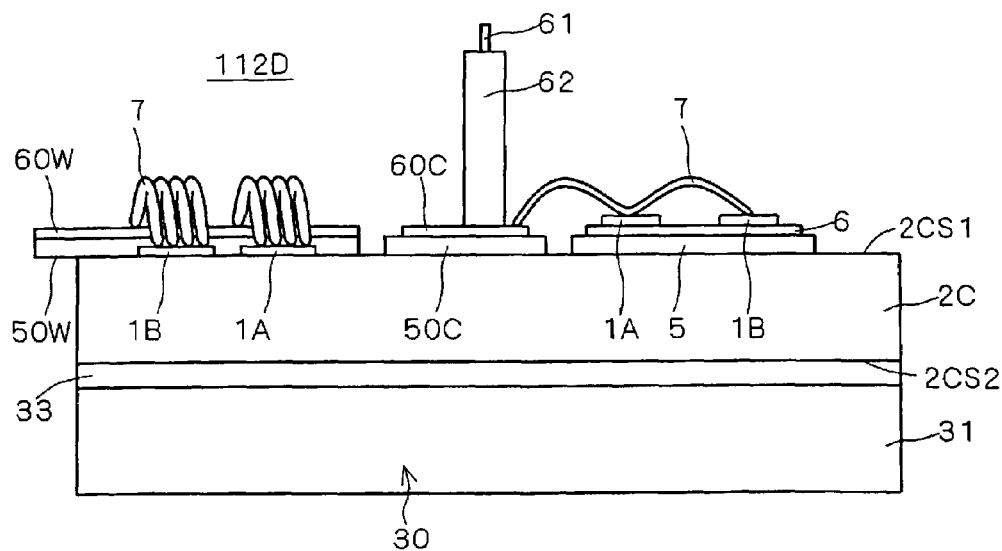
FIGS. 26 and 27 are schematic external views of a power module as an example of modification in the tenth preferred embodiment.
Figure 27:
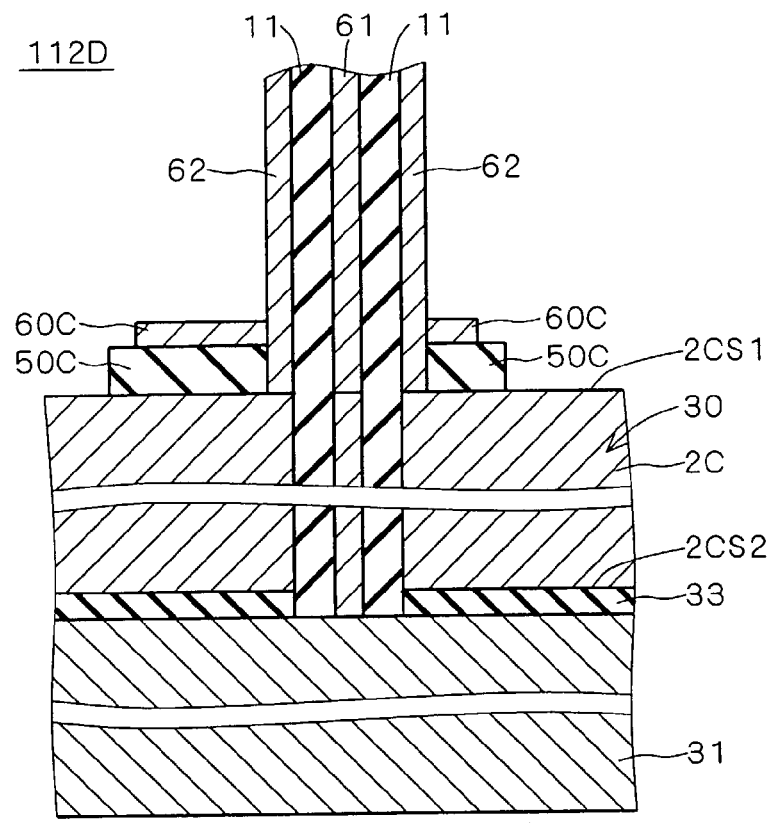

FIG. 26 is a schematic external view and FIG. 27 is a schematic longitudinal sectional view of a power module 112D as an example of modification in the tenth preferred embodiment. Like the aforementioned power module 111D, the power module 112D is a so-called three-phase voltage type power transducer.

As is evident from the comparison between FIG. 26 and FIG. 24 described earlier, the power module 112D comprises the capacitor electrode 31 and the capacitor dielectric 33, instead of the capacitor 20 in the power module 111D. More specifically, the capacitor dielectric 33, which is located in face-to-face contact with the main surface 2CS2 of the heat sink 2C, is sandwiched between the heat sink 2C and the capacitor electrode 31. Thus, the heat sink 2C, the capacitor dielectric 33, and the capacitor electrode 31 constitute the aforementioned plate capacitor 30. As in the power module 111D, the rod-shaped electrode 61 in the power module 112D extends through the heat sink 2C and the capacitor dielectric 33 and is electrically connected to the capacitor electrode 31. The power module 112D is in all other aspects identical to the power module 111D, thereby achieving similar effects to those of the power module 111D.

In the power module 112D, the diodes 1A and the IGBTs 1B can be considered to be located on the rear electrode of the capacitor 30. Thus, the power module 112D can achieve similar effects to those of the power module 112.

Eleventh Preferred Embodiment

Figure 28:
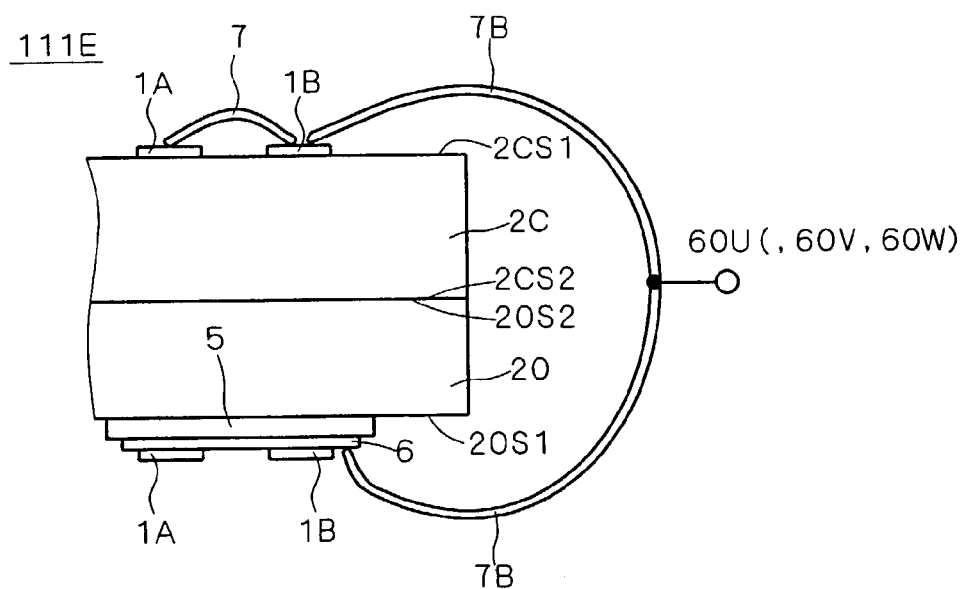
Figure 29:
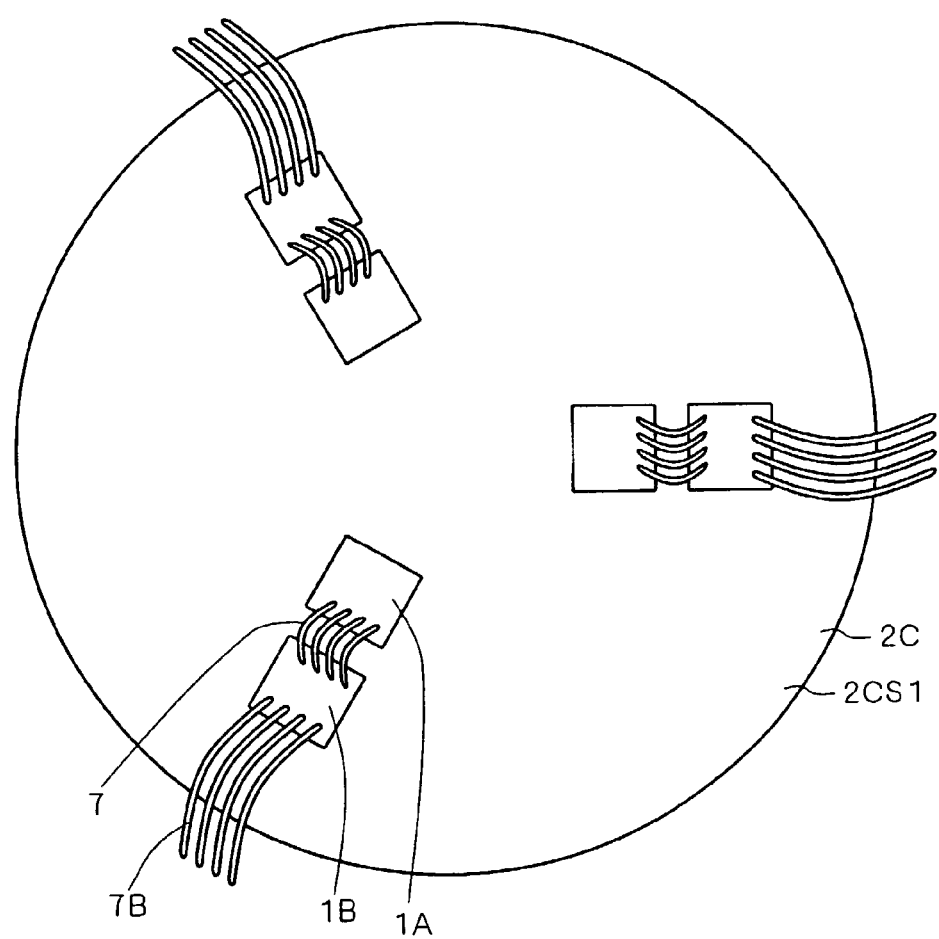

FIGS. 28 through 30 are schematic diagrams of a power module 111E according to an eleventh preferred embodiment. Because the power module 111E is based on the aforementioned power module 111D and for the sake of simplicity, part of the wires 7 are not illustrated in FIG. 28 and the electrodes 60U, 60V, 60W and the like are not illustrated in FIGS. 29 and 30.

While in the aforementioned power module 111D, all the diodes 1A and the IGBTs 1B are disposed on one main surface 2CS1 of the heat sink 2C, the diodes 1A and the IGBTs 1B in the power module 111E are spread over the main surface 2CS1 of the heat sink 2C and the surface 20S1 of the capacitor 20.

More specifically, the diodes 1A and the IGBTs 1B, forming the lower arms of the power transducer, are disposed directly on the main surface 2CS1 of the heat sink 2C (see FIG. 29). The front electrodes of the diode 1A and the IGBT 1B of each lower arm are connected with each other. On the other hand, the insulating substrates 5 are disposed on the surface 20S1 (more correctly the front electrode) of the capacitor 20, and the diodes 1A and the IGBTs 1B, forming the upper arms of the power transducer, are disposed on the conductive layers 6 formed on the insulating substrates 5 (see FIG. 30). The front electrodes of the diodes 1A and the IGBTs 1B on the insulating substrates 5 are connected to the surface 20S1 of the capacitor 20.

The conductive layers 6, which have electrical connections with the rear electrodes of the upper-arm IGBTs 1B, are connected to the front electrodes of the lower-arm IGBTs 1B to form the arms of the power transducer (see the wires 7B). The above junction points at the three arms form the electrodes 60U, 60V, and 60W. Thus, the power module 111E can achieve similar effects to those of the power module 111D.

In the power module 111E, the heat sink 2C is connected to the low potential side and the front electrode of the capacitor 20 to the high potential side. Although not illustrated in FIGS. 28 to 30, the coaxial line as in the power module 111D (cf. FIG. 25) may be used for the supply of power; in such a case, the electrode 62 is the "first electrode" and the electrode 61 is the "second electrode".

Further, as can be seen from the relationship between the power modules 111D and 112D, the capacitor 20 in the power module 111E may be replaced with the capacitor dielectric 33 and the capacitor electrode 31.

Twelfth Preferred Embodiment

Figure 31:
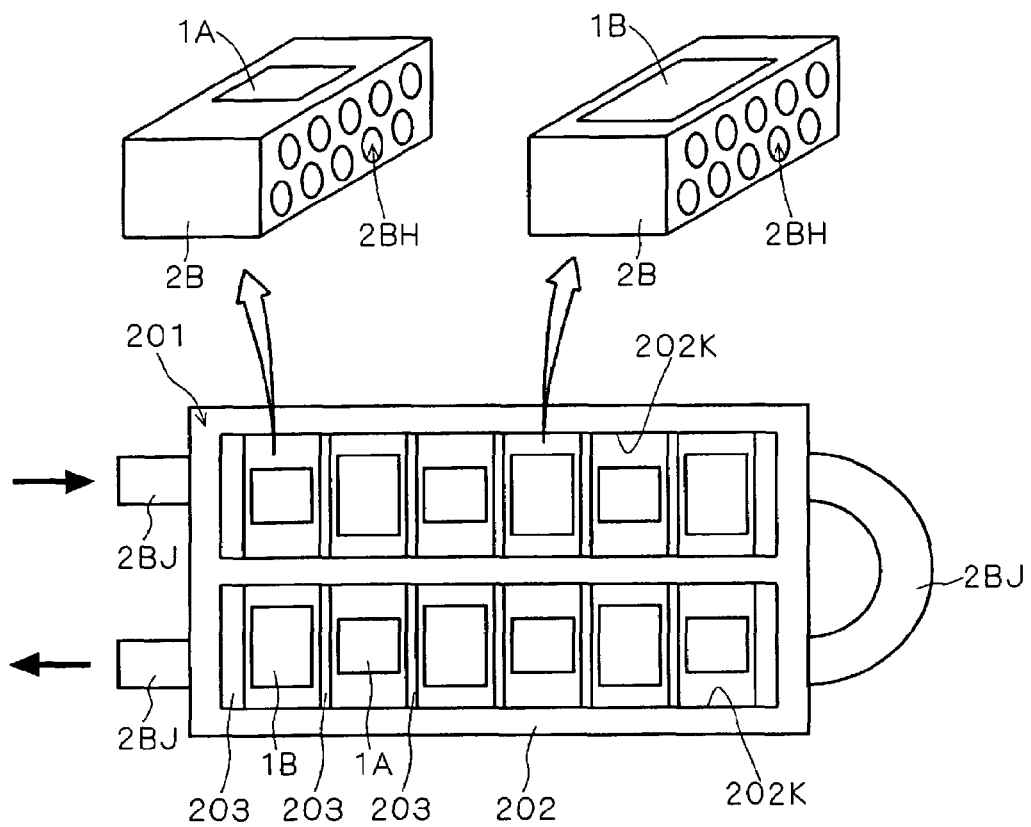
FIG. 31 is a schematic external view of a power module according to a twelfth preferred embodiment.

FIG. 31 is a schematic external view of a power module 201 according to a twelfth preferred embodiment. The power module 201 comprises an insulative casing 202 with two recesses (spaces) 202K. In the casing 202, each recess 202K houses a row of alternate heat sinks 2B: ones with the diode 1A directly disposed thereon and the others with the IGBT 1B directly disposed thereon. The connections between the diodes 1A and the IGBT 1B are not illustrated in FIG. 31.

In each recess 202K, a clearance 203 is created between each of the heat sinks 2B. The orientation of the heat sinks 2B and the through holes 2BH is determined so that the adjacent clearances 203 between the heat sinks 2B form contiguous space with the through holes 2BH. Further, the sizes of the heat sinks 2B and the recesses 202K are defined in order not to create any other clearance than the clearances 203 between the inside surfaces of the recesses 202K and the heat sinks 2B.

The clearances 203 are also created at both ends of the alignment of the heat sinks 2B in each recess 202K, and each recess 202K or casing 202 has holes connected to those clearances 203. One of such holes of each recess 202K is connected to the pipe 2BJ, and the other hole is connected to the same of the other recess 202K by the pipe 2BJ. Thus, the two recesses 202K are coupled together.

The clearances 203 are covered with an insulative cover (not shown) which is part of the casing 202, so both the recesses 202K form continuous space. In the power module 201, therefore, a cooling medium is poured from the above one of the holes of either of the recesses 202K thereby to pass the cooling medium through both the recesses 202K. At this time, since the casing 202 and the above cover are both insulative, the use of an insulative cooling medium for example allows the heat sinks 2B to be insulated from each other (insulative coupling). Examples of such an insulative cooling medium include gas such as air and sulfur hexafluoride ($SF_6$), or liquid such as water and oil. Further, the use of a conductive cooling medium for example allows the conductive heat sinks 2B to be at the same potential (conductive coupling). Alternatively, when insulative and conductive heat sinks 2B are combined and a conductive cooling medium is used, conductive coupling of only desired conductive heat sinks 2B becomes possible.

The diodes 1A and/or the IGBTs 1B may be disposed through the insulating substrates 5 over the heat sinks 2B. In this case, even with the use of conductive heat sinks 2B, desired diodes 1A and/or the IGBTs 1B can be insulated from others. Conversely, conductive/insulative properties of the heat sinks 2B can eliminate the need of the insulating substrates 5 as above described. Alternatively, a plurality of power semiconductor devices may be disposed on a single heat sink 2B.

Since the heat sinks 2B are aligned with the clearance 203 therebetween, the cooling medium passes through alternately the clearances 203 and the through holes 2BH narrower than the clearance 203. When passing through the through holes 2BH, i.e., when passing under the diodes 1A and the IGBTs 1B as heating elements, the cooling medium flows faster than when passing through the clearances 203. This improves cooling effects. On the other hand, since the flow of the cooling medium when passing through the clearances 203 is slower than when the cooling medium passes through the through holes 2BH, pressure loss can be suppressed. The power module 201 can thus achieve higher cooling performance with smaller pressure loss.

As above described, the use of an insulative cooling medium makes it possible to insulate the power semiconductor devices from each other without the use of the insulating substrates 5, even if the diodes 1A and/or the IGBTs 1B are disposed directly on the conductive heat sink 2B. This allows a reduction in the number of components by the number of insulating substrates 5. Also, since the heat sinks 2B with the diode 1A and/or the IGBT 1B are broadly equivalent in construction, manufacturing cost and price of the power module as a whole can be reduced.

Because each of the above power semiconductor devices are insulated from each other, they can be disposed directly on the conductive heat sink 2B. This improves heat radiating performance of the power module, resulting in improvements in reliability.

Thirteenth Preferred Embodiment

Figure 32:
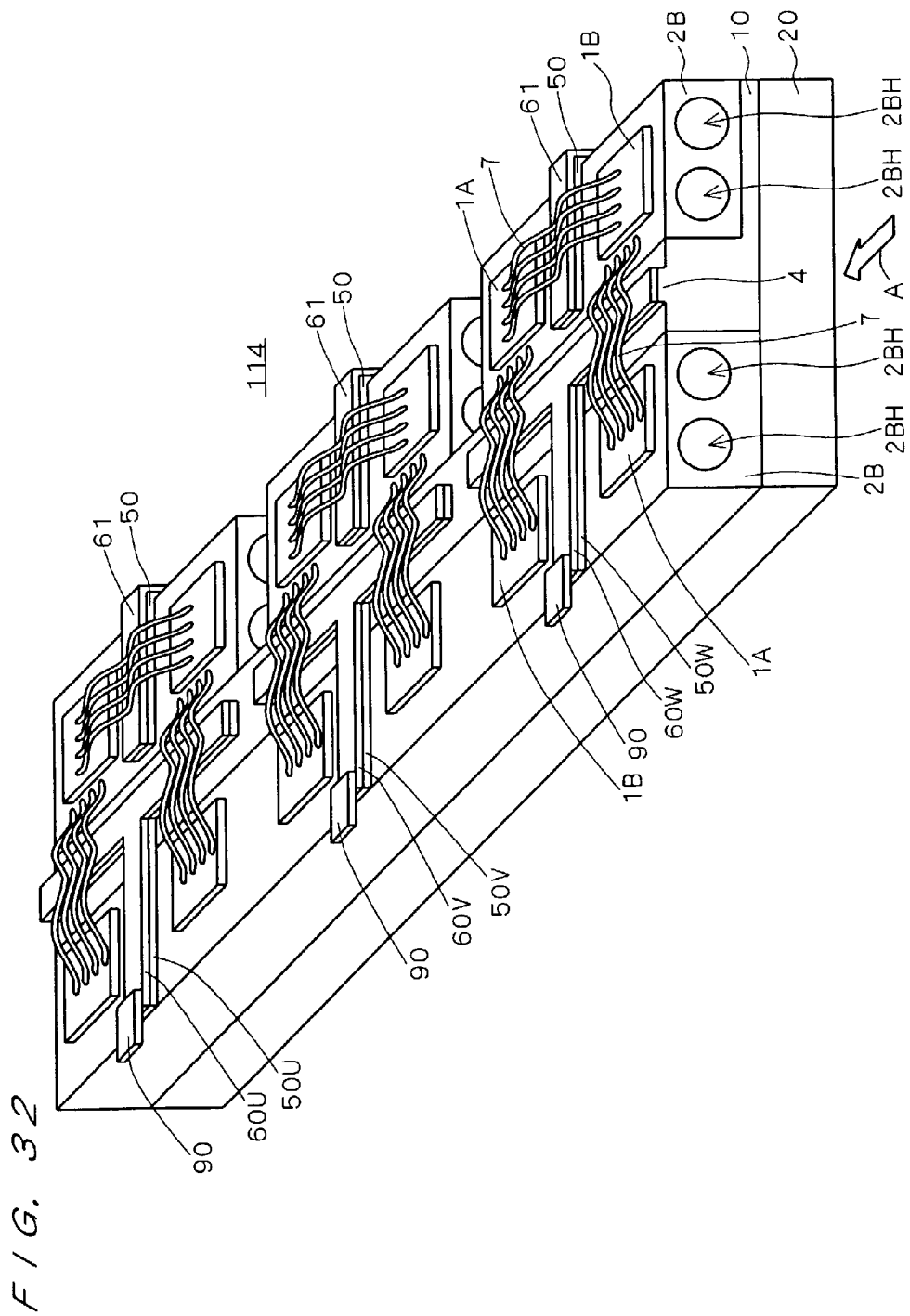
FIG. 32 is a schematic external view of a power module according to a thirteenth preferred embodiment.

FIG. 32 is a schematic external view of a power module 114 according to a thirteenth preferred embodiment. As shown in FIG. 32, the power module 114 further comprises shunt resistors 90 for measuring current, besides the components of the aforementioned power module 113 shown in FIG. 22. More specifically, the shunt registers 90 make direct connections with the output ends of the electrodes 60U, 60V, and 60W, and each of the shunt register 90 forms the output terminal of the power transducer.

The power module 114 measures current using the shunt registers 90 which do not require a control power source and would have no offset in principle unlike the current transformer 92P in the conventional power modules 101P or the like.

Since the shunt registers 90 are directly connected to the output ends of the electrodes 60U, 60V, and 60W, the power module as a whole can be made lighter and smaller than the conventional power modules 101P or the like wherein the current transformer 92P is provided independently outside the case. Also, the number of current-measuring components can be reduced.

Example of Modification in Thirteenth Preferred Embodiment

Figure 33:
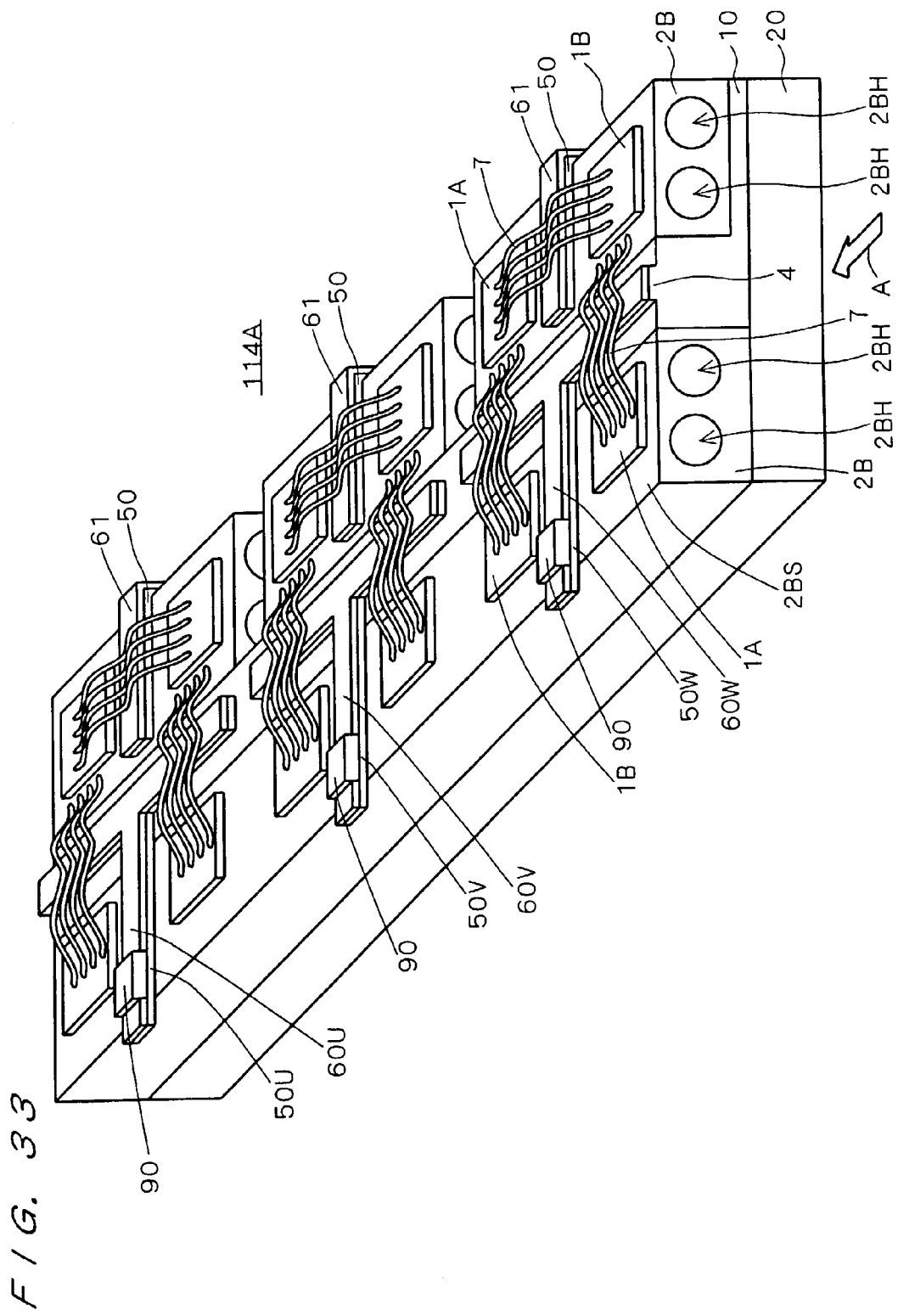
FIG. 33 is a schematic external view of a power module as an example of modification in the thirteenth preferred embodiment.

FIG. 33 is a schematic external view of a power module 114A as an example of modification in the thirteenth preferred embodiment. As is evident from the comparison between FIG. 33 and FIG. 32 described earlier, the shunt resistors 90 in the power module 114A are directly connected to the electrodes 60U, 60V, and 60W in face-to-face relationship with the surface 2BS of the heat sink 2B.

In the power module 114A, the temperature rise in the shunt registers 90 can be inhibited by the action of the heat sinks 2B. This considerably prevents changes in the characteristics of the shunt resistors 90 due to temperature variations, resulting in further improvements in accuracy in detecting the amount of current. Further, since the shunt registers 90 are located above the heat sinks 2B, the power module 114A can be made lighter and smaller than the aforementioned power module 114.

While the invention has been shown and described in detail, the foregoing description is in all aspects illustrative and not restrictive. It is therefore understood that numerous modifications and variations can be devised without departing from the scope of the invention.

What is claimed is:

1. A power module comprising:
   a capacitor having a capacitor dielectric and a pair of electrodes disposed so as to sandwich said capacitor dielectric; and
   a first semiconductor device disposed directly on one of the pair of electrodes of said capacitor, wherein
   said one of the pair of electrodes of said capacitor has a passage for a cooling medium.

2. A power module comprising:
   a capacitor;
   a first semiconductor device disposed directly on an electrode of said capacitor;
   an insulating substrate disposed on said electrode of said capacitor;
   a second semiconductor device disposed through said insulating substrate over said electrode of said capacitor, wherein
   said first semiconductor device and said second semiconductor device are electrically connected with each other;
   said first semiconductor device forms a lower arm of a power transducer; and
   said second semiconductor device forms an upper arm of said power transducer.

3. The power module according to claim 2, further comprising:
   a plurality of arms of said power transducer, including said upper arm and said lower arm; and
   a coaxial line protruding through a surface on which said first and second power semiconductor device is disposed, said coaxial line including a first electrode for supplying a first voltage to said first power semiconductor device of each of said lower arms and a second electrode for supplying a second voltage to said second power semiconductor device of each of said upper arms,
   wherein said plurality of arms are angularly spaced at regular intervals about said coaxial line.

4. A power module comprising:
   a capacitor having a capacitor dielectric and a pair of electrodes disposed so as to sandwich said dielectric; and a first power semiconductor device having two main surfaces with at least one power semiconductor device electrode provided on at least one main surface of the two main surfaces, the at least one power semiconductor device electrode being disposed on and in electrical contact with one of the pair of electrodes of said capacitor, wherein said one of said pair of electrodes of said capacitor forms a heat sink configured to have a larger surface area than the other one of said pair of electrodes.

* * * * *